US012583019B2

(12) United States Patent
Kuwahara et al.

(10) Patent No.: US 12,583,019 B2
(45) Date of Patent: *Mar. 24, 2026

(54) SUBSTRATE TREATING APPARATUS AND SUBSTRATE TRANSPORTING METHOD

(71) Applicant: SCREEN Holdings Co., Ltd., Kyoto (JP)

(72) Inventors: Joji Kuwahara, Kyoto (JP); Koji Kaneyama, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 674 days.

This patent is subject to a terminal disclaimer.

(21) Appl. No.: 18/159,360

(22) Filed: Jan. 25, 2023

(65) Prior Publication Data

US 2023/0166301 A1     Jun. 1, 2023

Related U.S. Application Data

(62) Division of application No. 17/576,325, filed on Jan. 14, 2022, now Pat. No. 11,590,540, which is a
(Continued)

(30) Foreign Application Priority Data

Dec. 28, 2018     (JP) ................................ 2018-248737

(51) Int. Cl.
*H01L 21/677* (2006.01)
*B08B 1/36* (2024.01)
(Continued)

(52) U.S. Cl.
CPC .................. *B08B 3/00* (2013.01); *B08B 1/36* (2024.01); *B08B 3/04* (2013.01);
(Continued)

(58) Field of Classification Search
CPC ......... H01L 21/67745; H01L 21/67775; H01L 21/67778; B08B 3/04
See application file for complete search history.

(56) References Cited

U.S. PATENT DOCUMENTS

| | | | |
|---|---|---|---|
| 5,664,254 A | 9/1997 | Ohkura et al. ................. | 396/612 |
| 5,876,280 A | 3/1999 | Kitano et al. ................. | 454/187 |

(Continued)

FOREIGN PATENT DOCUMENTS

| | | |
|---|---|---|
| JP | H08-274143 A | 10/1996 |
| JP | 2007-189138 A | 7/2007 |

(Continued)

OTHER PUBLICATIONS

Notice of Allowance dated Jan. 1, 2025 for corresponding Chinese Patent Application No. 201911168674.1.
(Continued)

*Primary Examiner* — Gerald McClain
(74) *Attorney, Agent, or Firm* — OSTROLENK FABER LLP

(57) ABSTRACT

A substrate treating apparatus and a substrate transporting method wherein a platform is disposed on a first ID block, and a platform is placed on a second ID block. A currently-used carrier platform is provided only on the first ID block. Accordingly, a substrate is transported in both a forward path and a return path between the first ID block and a second treating block. The substrate is returned not to the first ID block but to the second ID block disposed between the two treating blocks in the return path.

4 Claims, 18 Drawing Sheets

Related U.S. Application Data division of application No. 16/724,431, filed on Dec. 23, 2019, now Pat. No. 11,260,429.

(51) Int. Cl.

| | | |
|---|---|---|
| *B08B 3/00* | (2006.01) | |
| *B08B 3/04* | (2006.01) | |

(52) U.S. Cl.

CPC .................. *H01L 21/67745* (2013.01); *H01L 21/67775* (2013.01); *H01L 21/67778* (2013.01)

(56) References Cited

U.S. PATENT DOCUMENTS

| | | | | |
|---|---|---|---|---|
| 6,473,151 | B1 | 10/2002 | Deguchi | .......................... 118/719 |
| 7,578,240 | B2 | 8/2009 | Shiwaku | ..................... 104/88.01 |
| 11,139,192 | B2 * | 10/2021 | Kuwahara | ......... H01L 21/67778 |
| 11,260,429 | B2 * | 3/2022 | Kuwahara | ........... H01L 21/6773 |
| 11,590,540 | B2 * | 2/2023 | Kuwahara | ......... H01L 21/67046 |
| 2001/0013161 | A1 * | 8/2001 | Kitano | ................ H01L 21/6715 |
| | | | | 118/58 |
| 2007/0166031 | A1 | 7/2007 | Hamada | .......................... 396/611 |
| 2008/0159832 | A1 | 7/2008 | Mituyoshi | ...................... 414/217 |
| 2010/0215460 | A1 | 8/2010 | Watanabe et al. | ............ 414/217 |
| 2011/0222994 | A1 | 9/2011 | Inagaki et al. | ........... 414/222.07 |
| 2013/0078059 | A1 | 3/2013 | Enokida et al. | ......... 414/222.13 |
| 2017/0244070 | A1 | 8/2017 | Bangert et al. | |

| | | | | |
|---|---|---|---|---|
| 2018/0061690 | A1 * | 3/2018 | Kure | ................... H01L 21/0274 |
| 2020/0211868 | A1 * | 7/2020 | Kuwahara | ......... H01L 21/67178 |
| 2020/0211880 | A1 * | 7/2020 | Kuwahara | ................. G03F 7/20 |
| 2020/0211881 | A1 * | 7/2020 | Kuwahara | ......... H01L 21/67742 |
| 2020/0211882 | A1 * | 7/2020 | Kuwahara | ......... H01L 21/67778 |

FOREIGN PATENT DOCUMENTS

| | | | |
|---|---|---|---|
| JP | 2011-187796 | A | 9/2011 |
| JP | 2012-069992 | A | 4/2012 |
| JP | 2013-222949 | A | 10/2013 |
| JP | 2014-003164 | A | 1/2014 |
| KR | 102005-0104456 | A | 11/2005 |
| KR | 102007-0023191 | A | 2/2007 |
| KR | 10-2008-0061290 | A | 7/2008 |
| KR | 102009-0069976 | A | 7/2009 |
| TW | 201733689 | A | 10/2017 |
| WO | WO 2009060541 | A1 | 5/2009 |

OTHER PUBLICATIONS

Office Action dated Jul. 1, 2020 for corresponding Taiwan Patent Application No. 108147761.

Notice of Allowance dated Feb. 1, 2021 for corresponding Korean Patent Application No. 10-2019-0166698.

Office Action dated May 31, 2022 for corresponding Japanese Patent Application No. 2018-248737.

* cited by examiner

SUBSTRATE TREATING APPARATUS AND SUBSTRATE TRANSPORTING METHOD

CROSS-REFERENCE TO RELATED APPLICATIONS

The present application is a divisional of U.S. patent application Ser. No. 17/576,325, filed Jan. 14, 2022, which is a divisional of U.S. patent application Ser. No. 16/724, 431, filed Dec. 23, 2019, which claims priority to Japanese Patent Application No. 2018-248737, filed Dec. 28, 2018, the contents of all of which are incorporated herein by reference.

BACKGROUND OF THE INVENTION

Field of the Invention

The present invention relates to a substrate treating apparatus for performing treatment on substrates and a substrate transporting method for the substrate treating apparatus. Examples of substrates include semiconductor substrates, substrates for flat panel displays (FPDs), glass substrates for photomasks, substrates for optical disks, substrates for magnetic disks, ceramic substrates, and substrates for solar cells. Examples of the FPDs include liquid crystal display devices and organic electroluminescence (EL) display devices.

Description of the Related Art

A currently-used substrate treating apparatus includes an indexer block (hereinafter referred to as an "ID block" as necessary), a first treating block, and a second treating block. The ID block, the first treating block, and the second treating block are arranged in line in this order (see, for example, Japanese Unexamined Patent Publication No. 2012-069992A).

The ID block includes a carrier platform on which a carrier capable of accommodating a plurality of substrates is placed. The first treating block includes a rear-face cleaning unit SSR. The second treating block includes an end-face cleaning unit SSB and a front-face cleaning unit SS. The ID block and the two treating blocks each include a substrate transport mechanism (robot).

Moreover, the substrate treating apparatus includes a stocker device (carrier buffer device) See for example, Japanese Unexamined Patent Application Publication No. 2011-187796A. The stocker device includes keeping shelves for keeping carriers, and a carrier transport mechanism.

SUMMARY OF THE INVENTION

However, the substrate treating apparatus described above possesses the following problems. The substrate treating apparatus transports a substrate to the ID block, the first treating block, and the second treating block in this order (forward path). During transportation in the forward path, the two treating blocks perform neither front-face cleaning nor rear-face cleaning on the substrate. Thereafter, the substrate treating apparatus transports the substrate to the second treating block, the first treating block, and the ID block in this order (return path). During transportation in the return path, the second treating block performs front-face cleaning on the substrate while the first treating block performs rear-face cleaning on the substrate. Such transportation of the substrate reciprocated between the ID block and the second treating block accompanies process of only passing the substrate through the blocks without any cleaning treatment. This may cause a reduced throughput in either the forward path or the return path.

The present invention has been made regarding the state of the art noted above, and its object is to provide a substrate treating apparatus and a substrate transporting method that achieve an enhanced throughput.

Solution to Problem

To achieve the object, the present invention provides a configuration as follows. One aspect of the present invention provides a substrate treating apparatus for performing treatment on a substrate. The substrate treating apparatus includes: a plurality of treating blocks arranged in line; a first indexer block connected to a treating block of the treating blocks on a first end and on which a first carrier platform for placing a carrier capable of accommodating substrates thereon is disposed; and a second indexer block disposed between at least one treating block on a first end side and at least one treating block on a second end side of the treating blocks and on which a second carrier platform for placing a carrier thereon is disposed; wherein the first indexer block takes a substrate from the carrier placed on the first carrier platform and sends the taken substrate to the at least one treating block on the first end side, the at least one treating block on the first end side performs a predetermined treatment on the sent substrate, and the second indexer block sends the substrate, treated in the at least one treating block on the first end side, to the at least one treating block on the second end side, the at least one treating block on the second end side performs a predetermined treatment on the sent substrate, and the second indexer block returns the substrate treated in the at least one treating block on the second end side to the carrier placed on the second carrier platform.

With the substrate treating apparatus according to the present invention, the first carrier platform is disposed in the first indexer block, and the second carrier platform is disposed in the second indexer block. A currently-used carrier platform is provided only in the first indexer block. Accordingly, the substrate is transported in both the forward path and the return path between the first indexer block and the treating block on the second end. According to this aspect of the present invention, the substrate is returned not to the first indexer block but to the second indexer block disposed between the at least one treating block on the first end side and the at least one treating block on the second end side in the return path. Consequently, transportation process by the at least one treating block on the first end side disposed between the first indexer block and the second indexer block is reduced in the return path. As a result, an entire throughput of the substrate treating apparatus can be enhanced.

Moreover, the following is preferred in the substrate treating apparatus. That is, the treating blocks include a first treating block configured to perform a first treatment, and a second treating block configured to perform a second treatment. The first indexer block is connected to the first treating block, the first treating block is connected to the second indexer block, and the second indexer block is connected to the second treating block. The first indexer block takes a substrate from the carrier placed on the first carrier platform and sends the taken substrate to the first treating block. The first treating block performs a first treatment on the substrate, having been sent from the first indexer block, and sends the substrate subjected to the first treatment to the second indexer block. The second indexer block sends the substrate subjected to the first treatment to the second treating block. The second treating block performs a second treatment on the substrate, having been sent from the second indexer block, and returns the substrate subjected to the second treatment to the second indexer block. The second indexer block returns the substrate subjected to the second treatment to the carrier placed on the second carrier platform.

The first carrier platform is disposed in the first indexer block, and the second carrier platform is disposed in the second indexer block. A currently-used carrier platform is provided only in the first indexer block. Accordingly, the substrate is transported in both the forward path and the return path between the first indexer block and the second treating block. According to this aspect of the present invention, the substrate is returned not to the first indexer block but to the second indexer block disposed between the two treating blocks in the return path. Consequently, transportation process by the first treating block disposed between the first indexer block and the second indexer block is reduced in the return path. As a result, an entire throughput of the substrate treating apparatus can be enhanced.

One aspect of the present invention provides a substrate treating apparatus for performing treatment on a substrate. The substrate treating apparatus includes: a plurality of treating blocks arranged in line; a first indexer block connected to a treating block of the treating blocks on a first end and on which a first carrier platform for placing a carrier capable of accommodating substrates thereon is disposed; and a second indexer block disposed between at least one treating block on a first end side and at least one treating block on a second end side of the treating blocks and on which a second carrier platform for placing a carrier thereon is disposed; wherein the second indexer block takes a substrate from the carrier placed on the second carrier platform and sends the taken substrate to the at least one treating block on the second end side, the at least one treating block on the second end side performs a predetermined treatment on the sent substrate, and the second indexer block sends the substrate, treated in the at least one treating block on the second end side, to the at least one treating block on the first end side, the at least one treating block on the first end side performs a predetermined treatment on the sent substrate, and the first indexer block returns the substrate treated in the at least one treating block on the first end side to the carrier placed on the first carrier platform.

With the substrate treating apparatus according to the present invention, the first carrier platform is disposed in the first indexer block, and the second carrier platform is disposed in the second indexer block. A currently-used carrier platform is provided only in the first indexer block. Accordingly, the substrate is transported in both the forward path and the return path between the first indexer block and the treating block on the second end. According to this aspect of the present invention, transportation of the substrate starts not from the first indexer block but from the second indexer block disposed between the at least one treating block on the first end side and the at least one treating block on the second end side in the forward path. Consequently, transportation process by the at least one treating block on the first end side disposed between the first indexer block and the second indexer block is reduced in the forward path. As a result, an entire throughput of the substrate treating apparatus can be enhanced.

Moreover, the following is preferred in the substrate treating apparatus. That is, the treating blocks include a first treating block configured to perform a first treatment, and a second treating block configured to perform a second treatment. The first indexer block is connected to the first treating block, the first treating block is connected to the second indexer block, and the second indexer block is connected to the second treating block. The second indexer block takes a substrate from the carrier placed on the second carrier platform and sends the taken substrate to the second treating block. The second treating block performs a second treatment on the substrate, having been sent from the second indexer block, and returns the substrate subjected to the second treatment to the second indexer block. The second indexer block sends the substrate subjected to the second treatment to the first treating block. The first treating block performs a first treatment on the substrate, having been sent from the second indexer block, and sends the substrate subjected to the first treatment to the first indexer block. The first indexer block returns the substrate subjected to the first treatment to the carrier placed on the first carrier platform.

The first carrier platform is disposed in the first indexer block, and the second carrier platform is disposed in the second indexer block. A currently-used carrier platform is provided only in the first indexer block. Accordingly, the substrate is transported in both the forward path and the return path between the first indexer block and the second treating block. According to this aspect of the present invention, transportation of the substrate starts not from the first indexer block but from the second indexer block disposed between the two treating blocks in the forward path. Consequently, transportation process by the first treating block disposed between the first indexer block and the second indexer block is reduced in the forward path. As a result, an entire throughput of the substrate treating apparatus can be enhanced.

It is preferred in the substrate treating apparatus described above that at least one of the first treating block and the second treating block includes a plurality of treatment layers arranged in an upward/downward direction. This yields increase in number of parallel treatments. In addition, the second indexer block is disposed between the first treating block and the second treating block. Accordingly, the first treating block may select the number of treatment layers different from that in the second treating block. Moreover, when the substrate is transported from a predetermined treatment layer in the first treating block, the second indexer block is capable of transporting the substrate while selecting any of the treatment layers in the second treating block, for example.

It is preferred that the substrate treating apparatus described above further includes a carrier transport mechanism configured to transport the carrier between the first carrier platform and the second carrier platform. For instance, when all the substrates are taken from the carrier placed on the first carrier platform, the carrier transport mechanism is capable of transporting the carrier placed on the first carrier platform to the second carrier platform since the transport mechanism returns the substrates to the carrier on the first carrier platform.

It is preferred in the substrate treating apparatus described above that the carrier transport mechanism is mounted on the first treating block. A currently-used carrier transport mechanism is disposed horizontally with respect to the indexer block. With the configuration of the present invention, the carrier transport mechanism is provided on the first treating block. Accordingly, an installation area of the currently-used carrier transport mechanism disposed horizontally with respect to the indexer block can be decreased. In other words, reduction in footprint of the substrate treating apparatus is obtainable.

Another aspect of the present invention provides a substrate transporting method for a substrate treating apparatus. The substrate treating apparatus includes: a plurality of treating block arranged in line; and a first indexer block connected to a treating block of the treating blocks on a first end and on which a first carrier platform for placing a carrier capable of accommodating substrates thereon is disposed; and the method includes: a taking and sending step of causing the first indexer block to take a substrate from the carrier placed on the first carrier platform and to send the taken substrate to at least one treating block on a first end side of the treating blocks; a second treating step of causing the at least one treating block on the first end side to perform a predetermined treatment on the sent substrate; and a first sending step of causing a second indexer block, disposed between the at least one treating block on the first end side and at least one treating block on a second end side of the treating blocks, to send the substrate treated in the at least one treating block on the first end side to the at least one treating block on the second end side; a first treating step of causing the at least one treating block on the second end side to perform a predetermined treatment on the sent substrate; a returning step of causing the second indexer block to return the substrate, treated in the at least one treating block on the second end side, to the carrier placed on a second carrier platform provided in the second indexer block.

With the substrate transporting method according to the present invention, the first carrier platform is disposed in the first indexer block, and the second carrier platform is disposed in the second indexer block. A currently-used carrier platform is provided only in the first indexer block. Accordingly, the substrate is transported in both the forward path and the return path between the first indexer block and the treating block on the second end. According to this aspect of the present invention, the substrate is returned not to the first indexer block but to the second indexer block disposed between the at least one treating block on the first end side and the at least one treating block on the second end side in the return path. Consequently, transportation process by the at least one treating block on the first end side disposed between the first indexer block and the second indexer block is reduced in the return path. As a result, an entire throughput of the substrate treating apparatus can be enhanced.

Another aspect of the present invention provides a substrate transporting method for a substrate treating apparatus. The substrate treating apparatus includes: a plurality of treating block arranged in line; and a first indexer block connected to a treating block of the treating blocks on a first end and on which a first carrier platform for placing a carrier capable of accommodating substrates thereon is disposed; and the method includes: a taking and sending step of causing a second indexer block, disposed between at least one treating block on a first end side and at least one treating block on a second end side of the treating blocks, to take a substrate from the carrier placed on a second carrier platform disposed in the second indexer block and to send the taken substrate to the at least one treating block on the second end side; a first treating step of causing the at least one treating block on the second end side to perform a predetermined treatment on the sent substrate; a first sending step of causing the second indexer block to send the substrate, treated in the at least one treating block on the second end side, to the at least one treating block on the first end side; a second treating step of causing the at least one treating block on the first end side to perform a predetermined treatment on the sent substrate; and a returning step of causing the first indexer block to return the substrate treated in the at least one treating block on the first end side to the carrier placed on the first carrier platform.

With the substrate transporting method according to the present invention, the first carrier platform is disposed in the first indexer block, and the second carrier platform is disposed in the second indexer block. A currently-used carrier platform is provided only in the first indexer block. Accordingly, the substrate is transported in both the forward path and the return path between the first indexer block and the treating block on the second end. According to this aspect of the present invention, transportation of the substrate starts not from the first indexer block but from the second indexer block disposed between the at least one treating block on the first end side and the at least one treating block on the second end side in the forward path. Consequently, transportation process by the at least one treating block on the first end side disposed between the first indexer block and the second indexer block is reduced in the forward path. As a result, an entire throughput of the substrate treating apparatus can be enhanced.

One aspect of the present invention provides a substrate transporting apparatus for performing treatment on a substrate. The substrate transporting apparatus includes: a plurality of treating blocks arranged in line; a first indexer block connected to a treating block of the treating blocks on a first end and on which a first carrier platform for placing a carrier capable of accommodating substrates thereon is disposed; and a second indexer block disposed between at least one treating block on a first end side and at least one treating block on a second end side of the treating blocks and on which a plurality of second carrier platforms for placing a carrier thereon is disposed; wherein the second indexer block takes a substrate from the carrier placed on a first platform of the second carrier platforms and sends the taken substrate to the at least one treating block on the second end side, the at least one treating block on the second end side performs a predetermined treatment on the sent substrate, and the second indexer block returns the substrate treated in the at least one treating block on the second end side to the carrier placed on the first platform, the second indexer block takes the substrate from the carrier placed on a second platform of the second carrier platforms and sends the taken substrate to the at least one treating block on the first end side, the at least one treating block on the first end side performs a predetermined treatment on the sent substrate, and the first indexer block returns the substrate treated in the at least one treating block on the first end side to the carrier placed on the first carrier platform.

With the substrate transporting apparatus according to the present invention, the first carrier platform is disposed in the first indexer block, and the second carrier platforms are disposed in the second indexer block. A currently-used carrier platform is provided only in the first indexer block. Accordingly, the substrate is transported in both the forward path and the return path between the first indexer block and the treating block on the second end. According to this aspect of the present invention, the substrate can be sent not to the at least one treating block on the first end side but to the treating block to the second end side. Consequently, substrate transportation process by the at least one treating block on the first end side is reduced. As a result, an entire throughput of the substrate treating apparatus can be enhanced.

Moreover, only one currently-used indexer block performs taking and accommodation of a substrate from and into the carrier. According to this aspect of the present invention, the second indexer block takes a substrate and transports the taken substrate to the at least one treating block on the first end side. Moreover, the first indexer block accommodates the substrate, sent from the at least one treating block on the first end side, into the carrier placed on the first carrier platform. That is, taking of a substrate is divided from accommodation of a substrate. Consequently, the second indexer block is capable of taking a substrate only, whereas the first indexer block is capable of accommodating a substrate only. As a result, an entire throughput of the substrate treating apparatus can be enhanced.

Another aspect of the present invention provides a substrate transporting method for a substrate treating apparatus. The substrate treating apparatus includes: a plurality of treating blocks arranged in line; and a first indexer block connected to a treating block of the treating blocks on a first end and on which a first carrier platform for placing a carrier capable of accommodating substrates thereon is disposed; and the method includes: a first taking and sending step of causing a second indexer block, disposed between at least one treating block on a first end side and at least one treating block on a second end side of the treating blocks, to take a substrate from the carrier placed on a first platform of the second carrier platforms in the second indexer block and to send the taken substrate to the at least one treating block on the second end side; a first treating step of causing the at least one treating block on the second end side to perform a predetermined treatment on the sent substrate; a returning step of causing the second indexer block to return back the substrate treated in the at least one treating block on the second end side to the carrier placed on the first platform, a second taking and sending step of causing the second indexer block to take the substrate from the carrier placed on a second platform of the second carrier platforms and to send the taken substrate to the at least one treating block on the first end side, a second treating step of causing the at least one treating block on the first end side to perform a predetermined treatment on the sent substrate; and a returning step of causing the first indexer block to return the substrate treated in the at least one treating block on the first end side to the carrier placed on the first carrier platform.

Advantageous Effects of Invention

The substrate treating apparatus and the substrate transporting method according to the present invention achieve an enhanced throughput.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIG. 2 is a horizontal cross-sectional view of the substrate treating apparatus according to the first embodiment.

8

Figure 7:
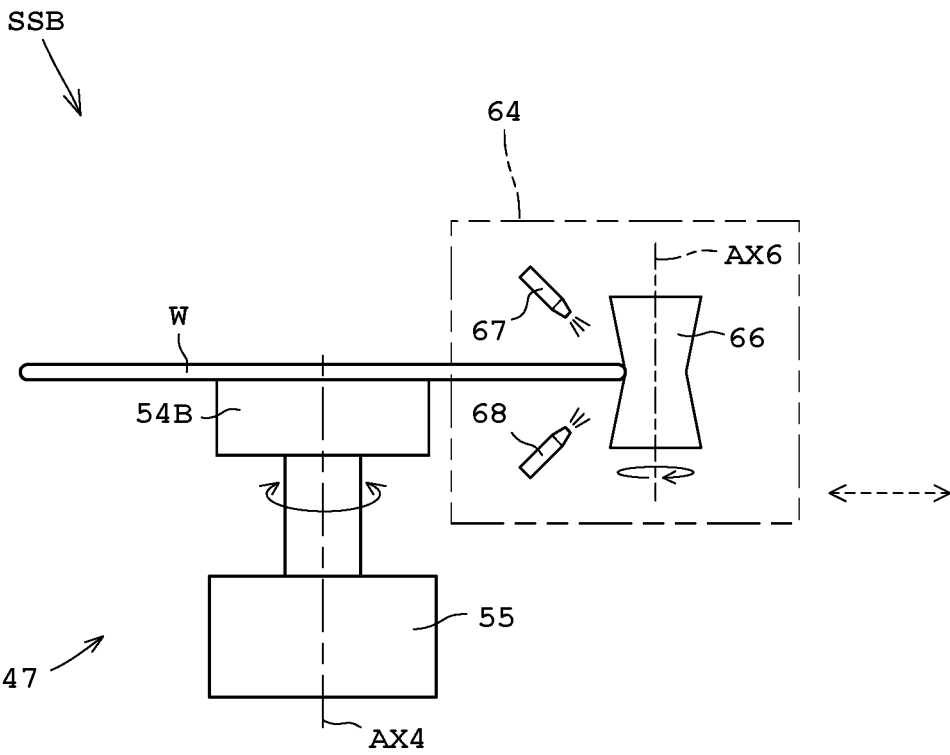

FIG. 7 illustrates an end-face cleaning unit.

Figure 8:
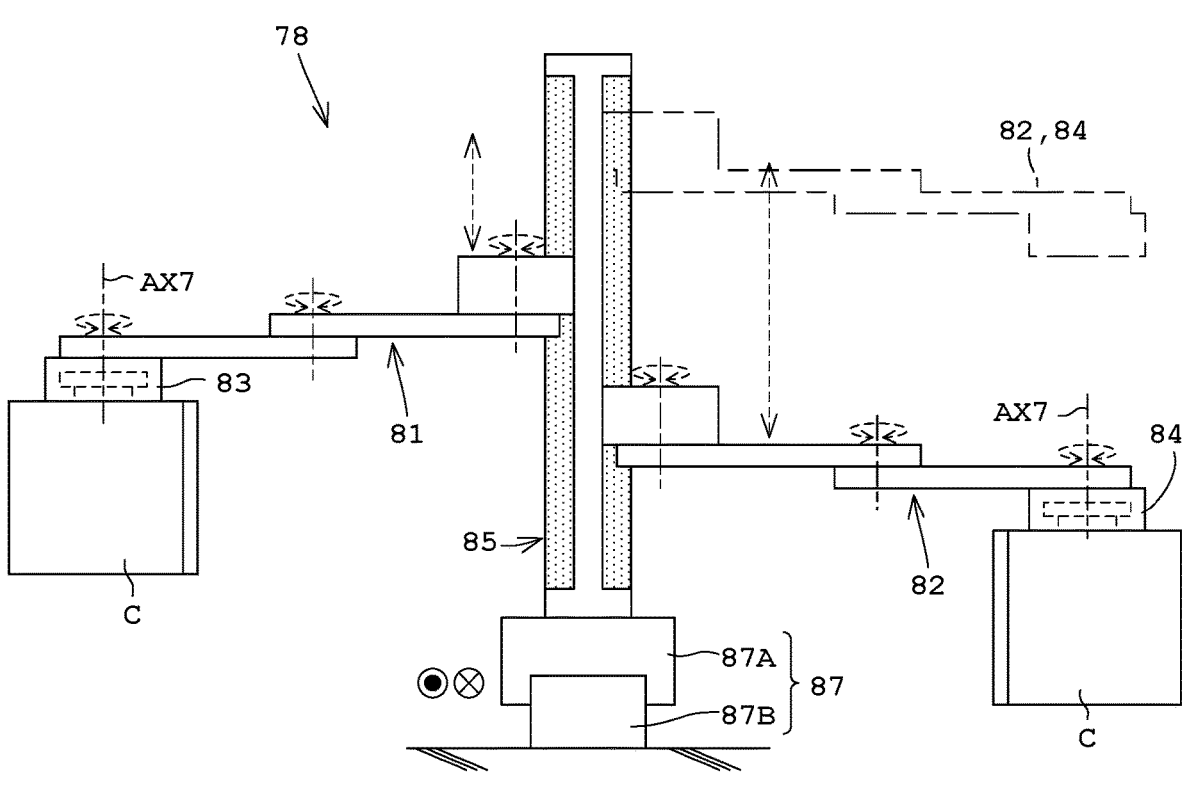

FIG. 8 illustrates a carrier transport mechanism.

Figure 9:
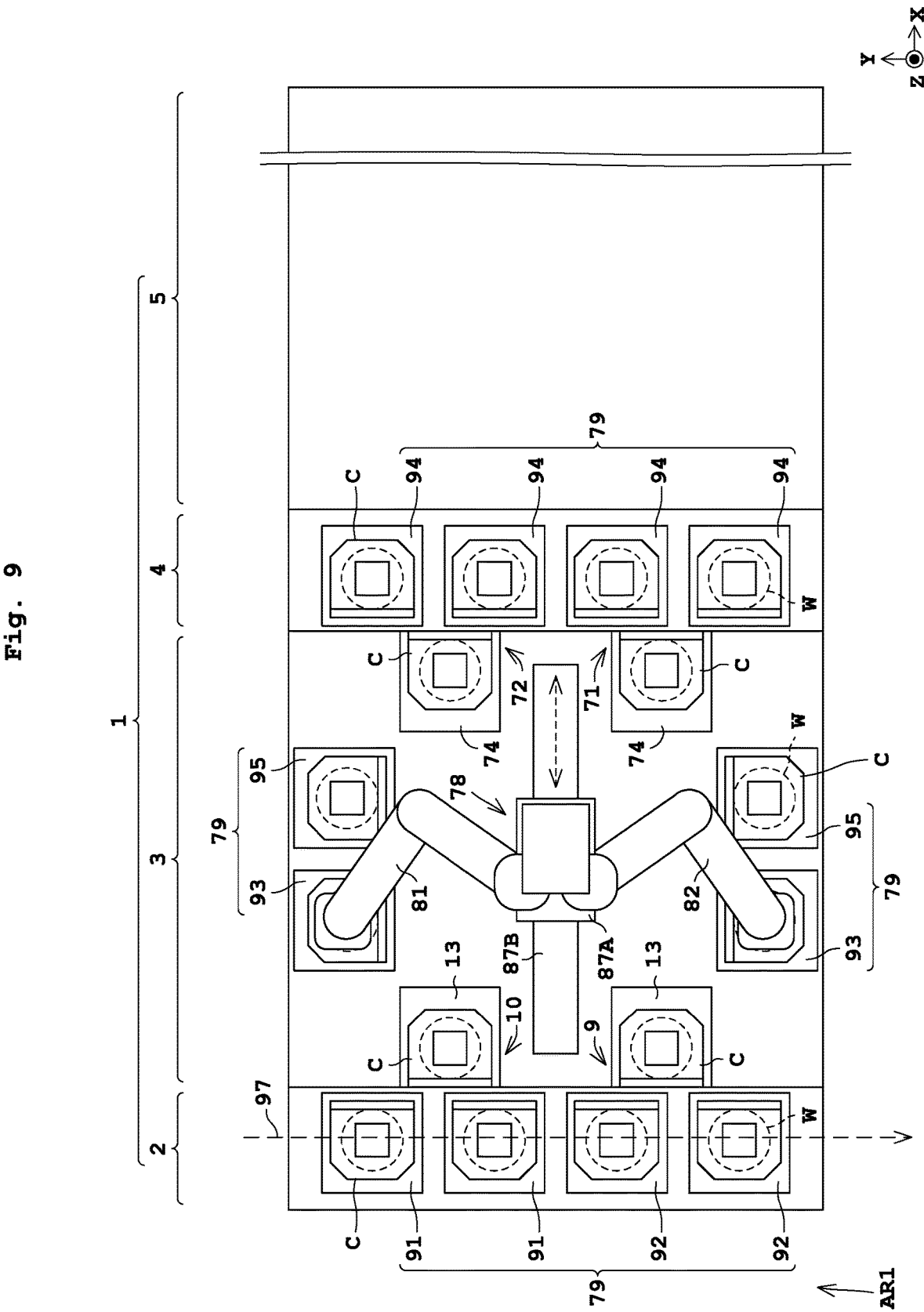

FIG. 9 is a plan view of a carrier buffer device.

Figures 10, 11:
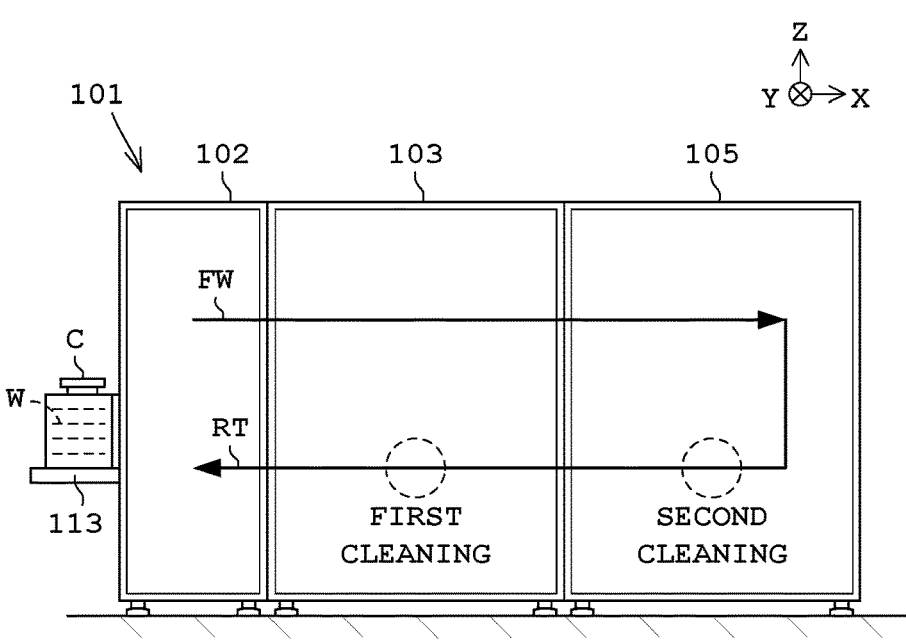

FIG. 10 illustrates operation of a currently-used substrate treating apparatus.

FIG. 11 illustrates operation of the substrate treating apparatus according to the first embodiment.

Figure 12:
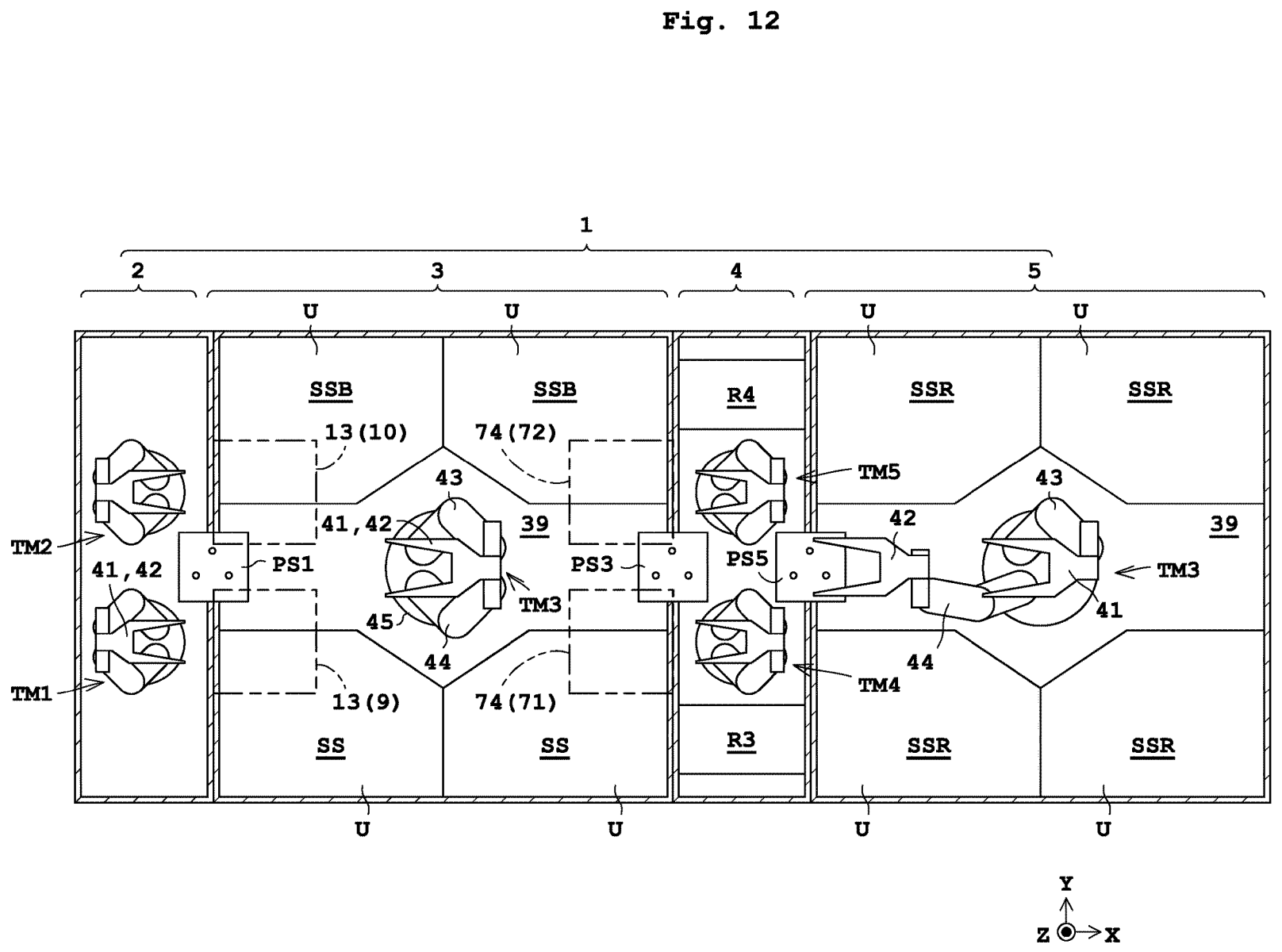

FIG. 12 is a horizontal cross-sectional view of a substrate treating apparatus according to a second embodiment.

Figure 13:
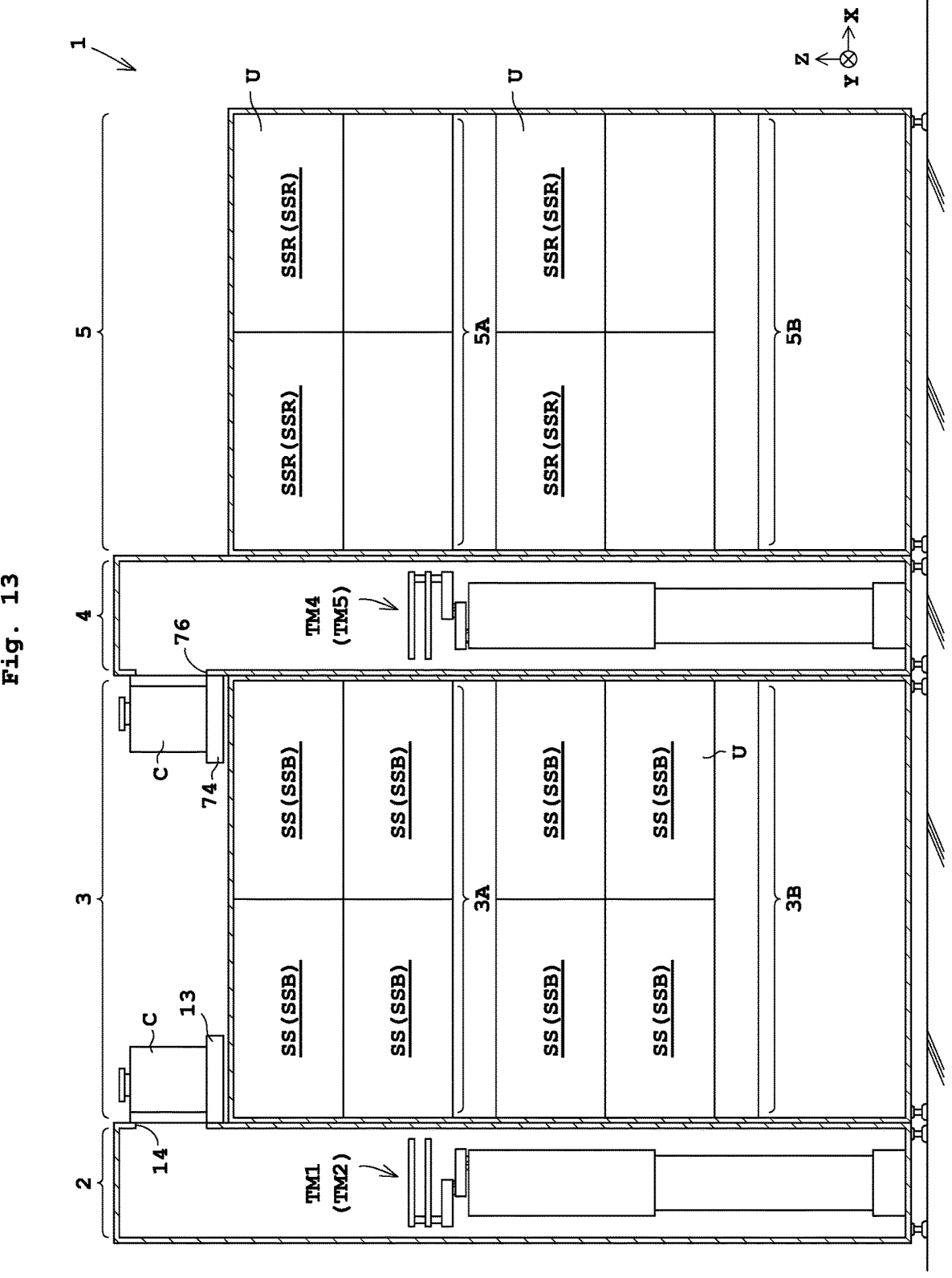

FIG. 13 is a right side view of the substrate treating apparatus according to the second embodiment.

Figure 14:
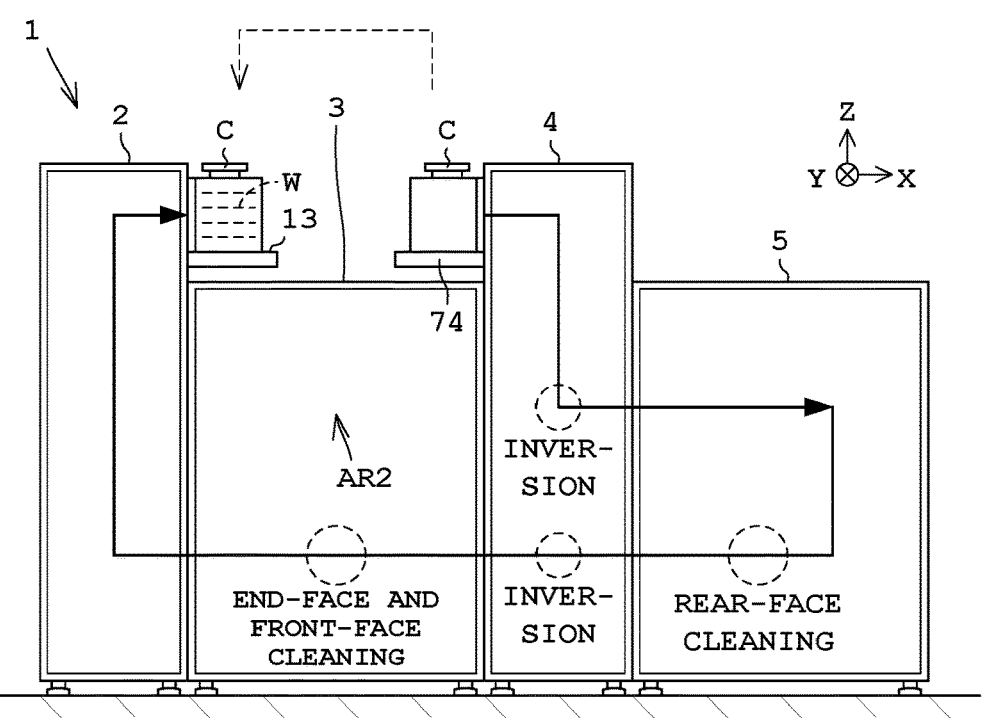

FIG. 14 illustrates operation of the substrate treating apparatus according to the second embodiment.

Figure 15:
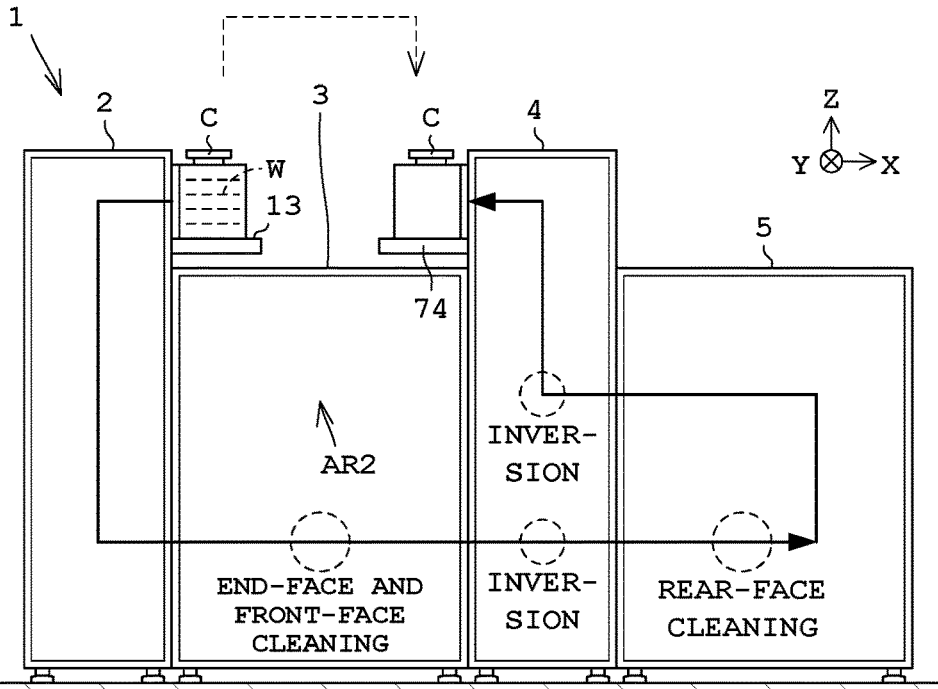

FIG. 15 illustrates operation of a substrate treating apparatus according to a third embodiment.

Figure 16:
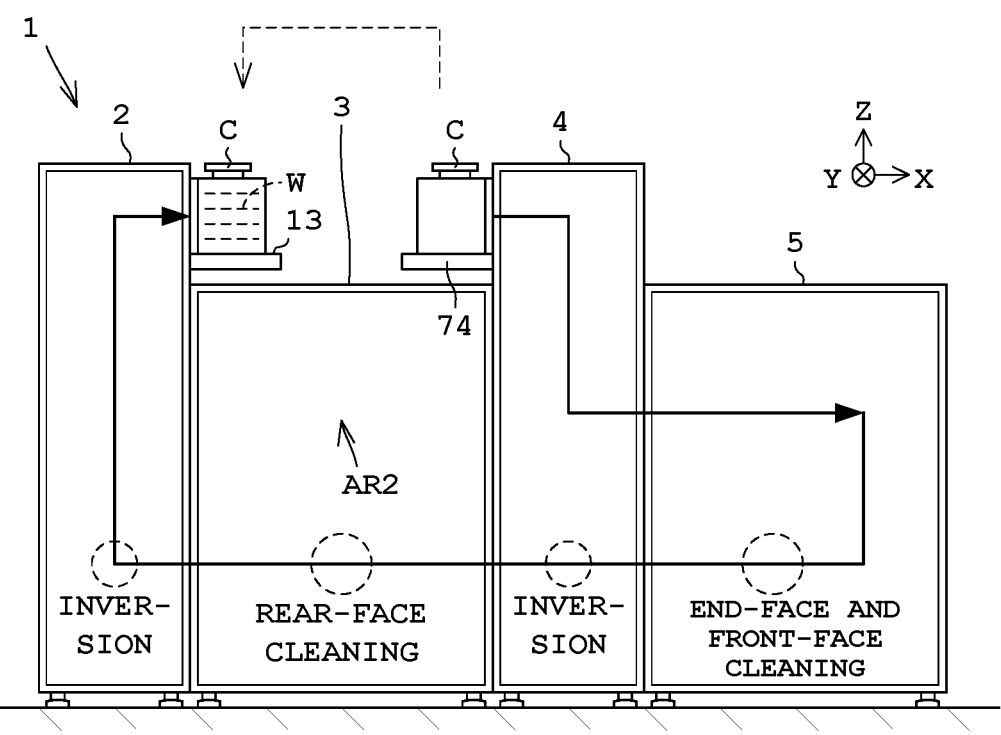

FIG. 16 illustrates operation of a substrate treating apparatus according to one modification of the present invention.

Figure 17:
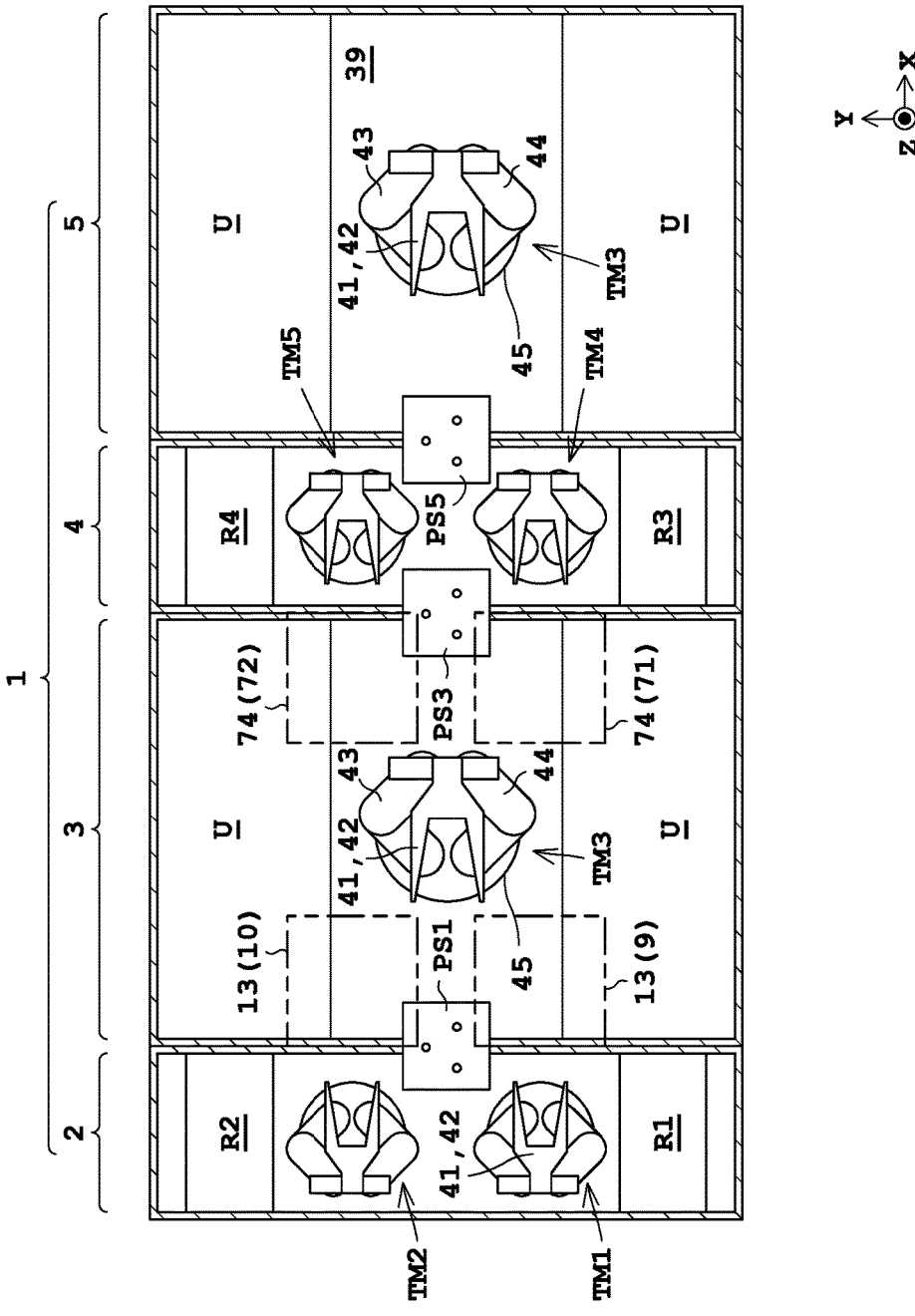

FIG. 17 is a transverse cross-sectional view of a substrate treating apparatus according to another modification.

Figure 18:
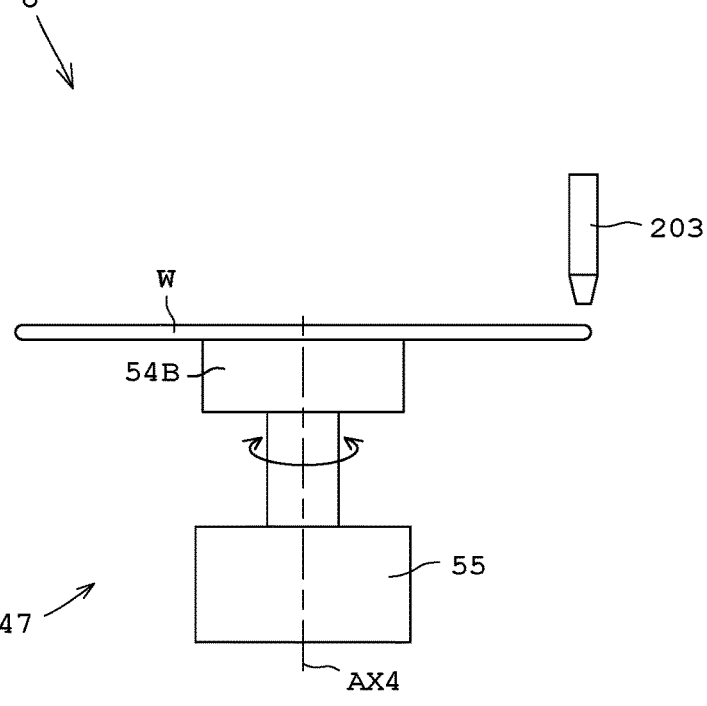

FIG. 18 illustrates a treating unit according to still another modification.

Figure 19:
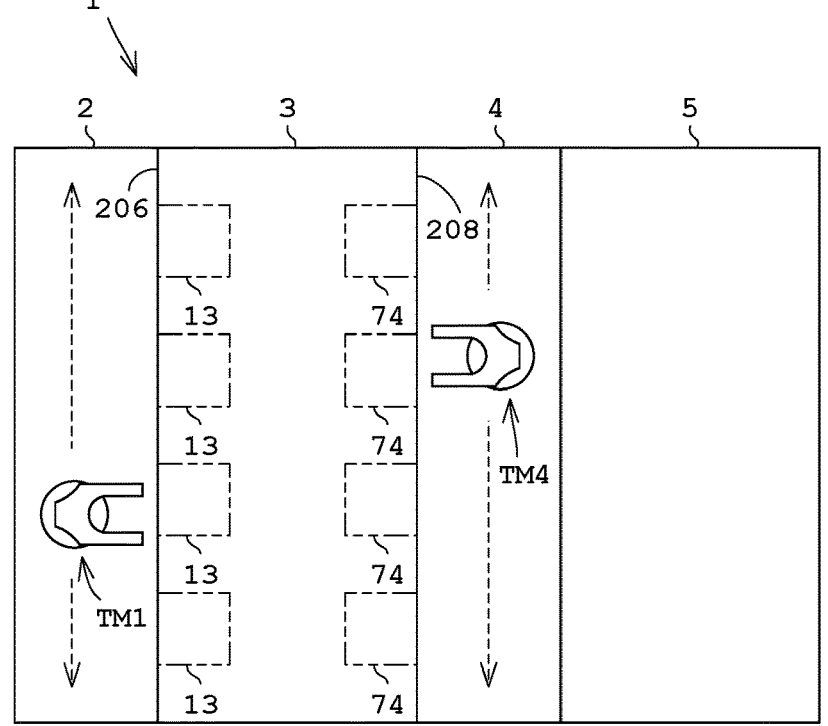
Figure 19:
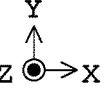

FIG. 19 illustrates a substrate transport mechanism and a platform of a substrate treating apparatus according to still another modification of the present invention.

Figures 20, 21:
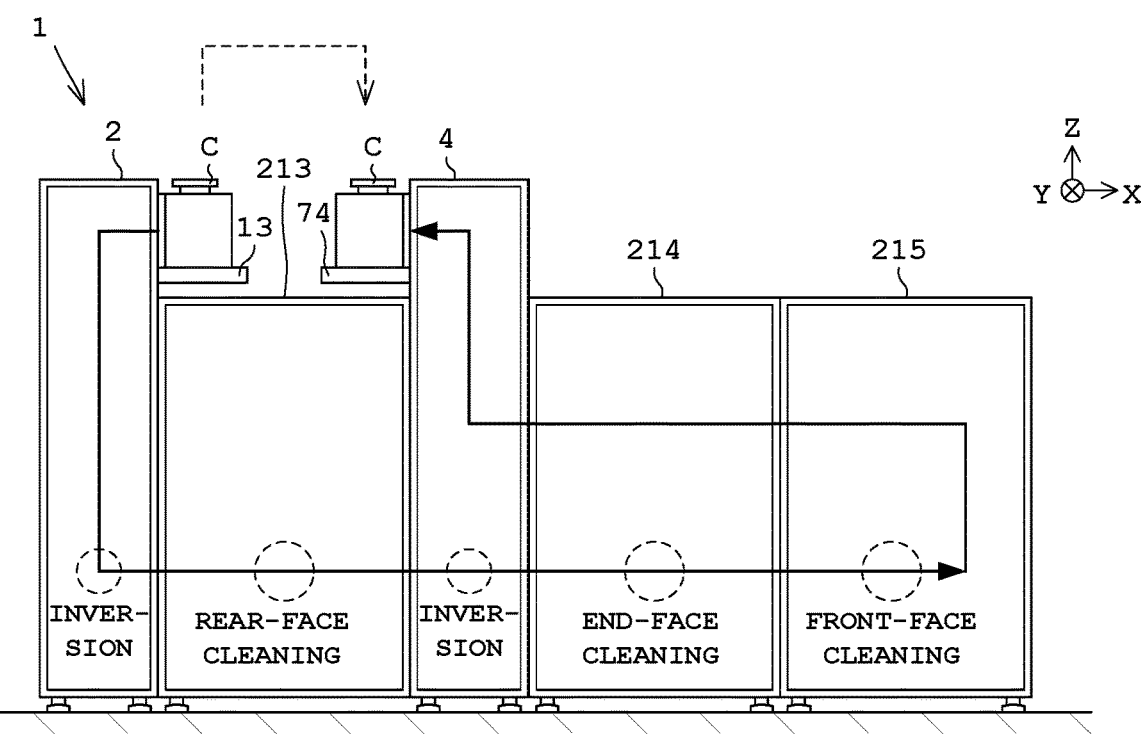

FIG. 20 illustrates a configuration and operation of a substrate treating apparatus according to still another modification of the present invention.

FIG. 21 illustrates a configuration and operation of a substrate treating apparatus according to still another modification of the present invention.

Figure 22:
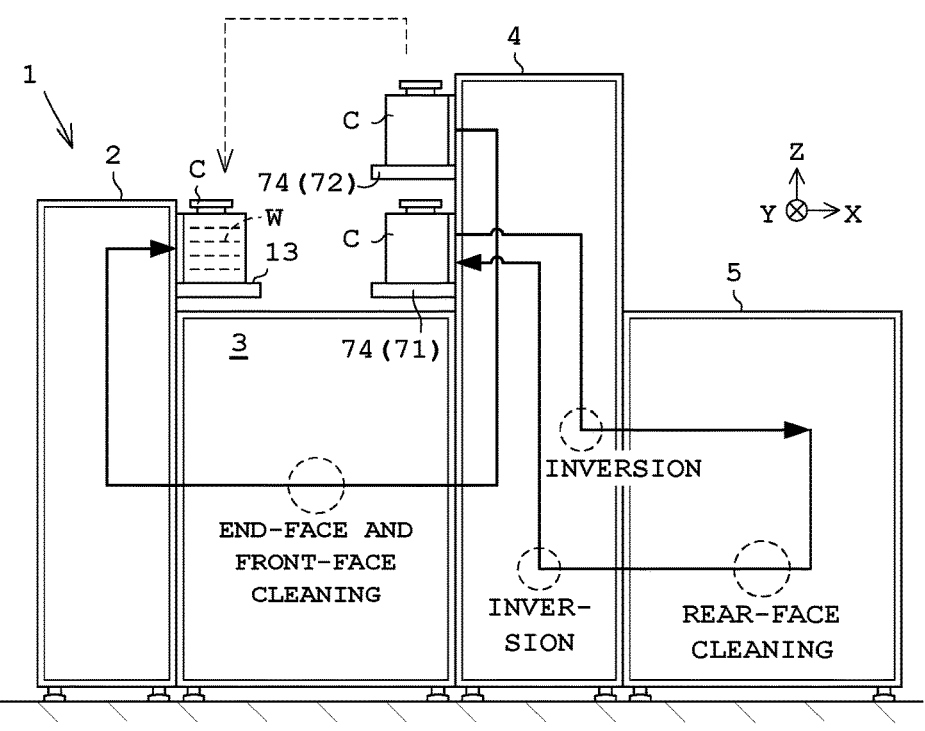

FIG. 22 illustrates a configuration and operation of a substrate treating apparatus according to still another modification of the present invention.

Figure 23:
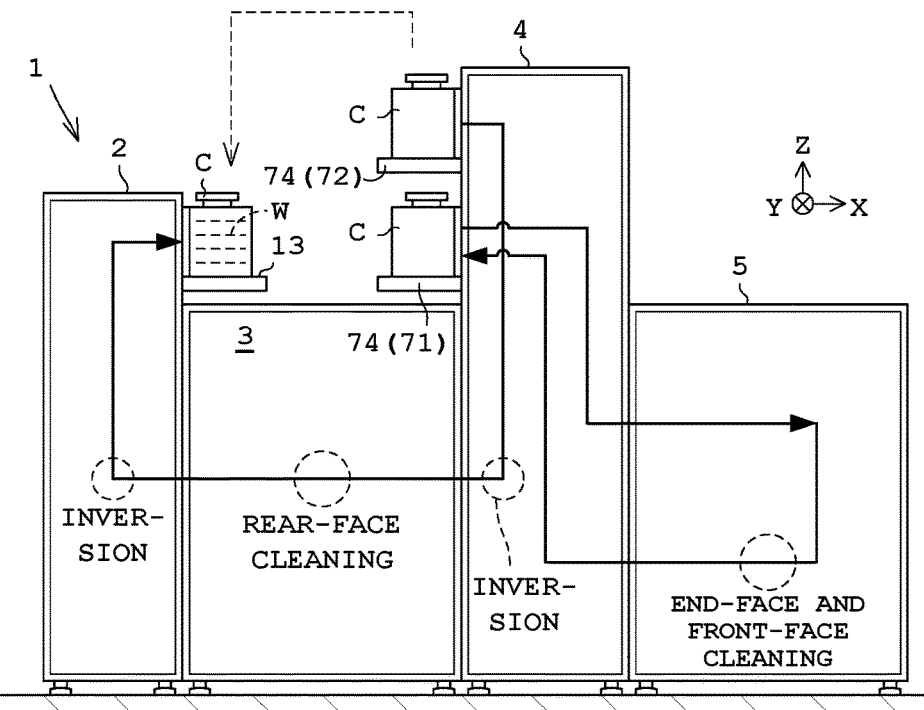

FIG. 23 illustrates a configuration and operation of a substrate treating apparatus according to still another modification of the present invention.

Figure 24:
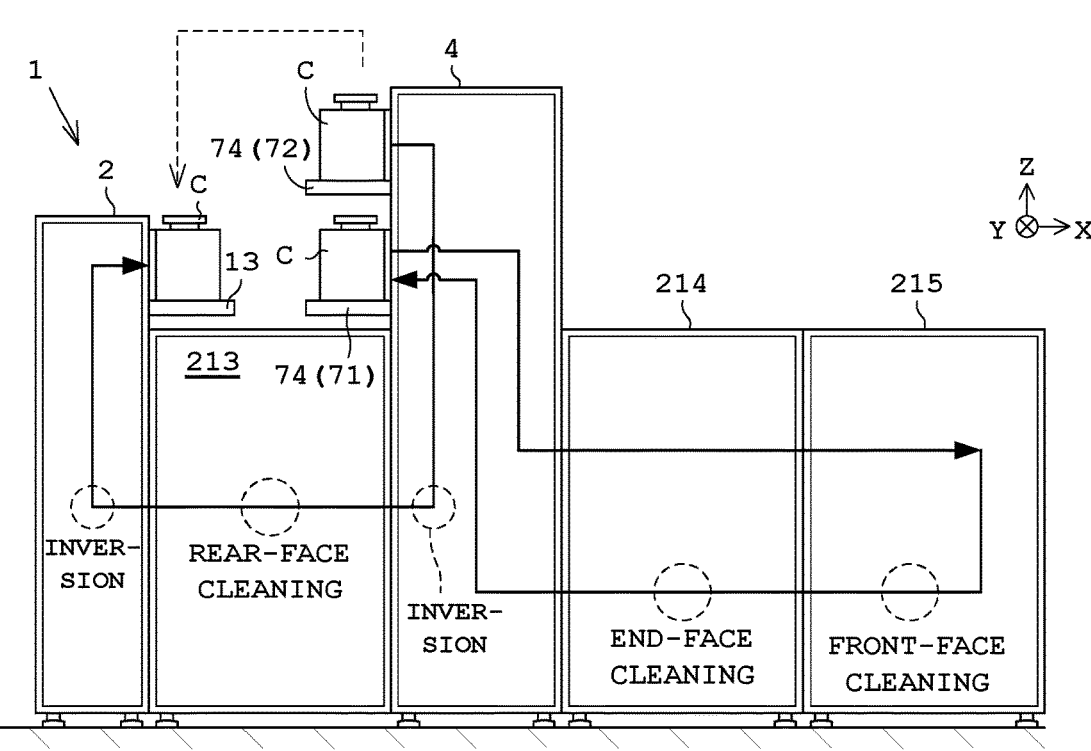

FIG. 24 illustrates a configuration and operation of a substrate treating apparatus according to still another modification of the present invention.

Figure 25:
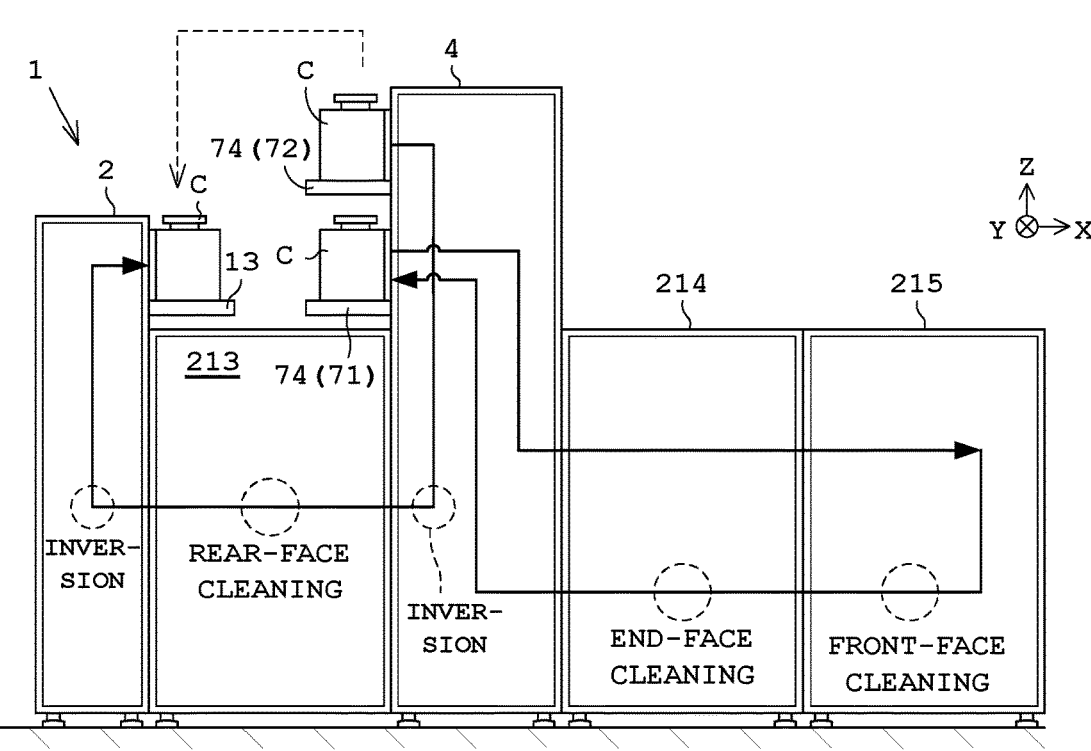

FIG. 25 illustrates a configuration and operation of a substrate treating apparatus according to still another modification of the present invention.

First Embodiment

Figure 1:
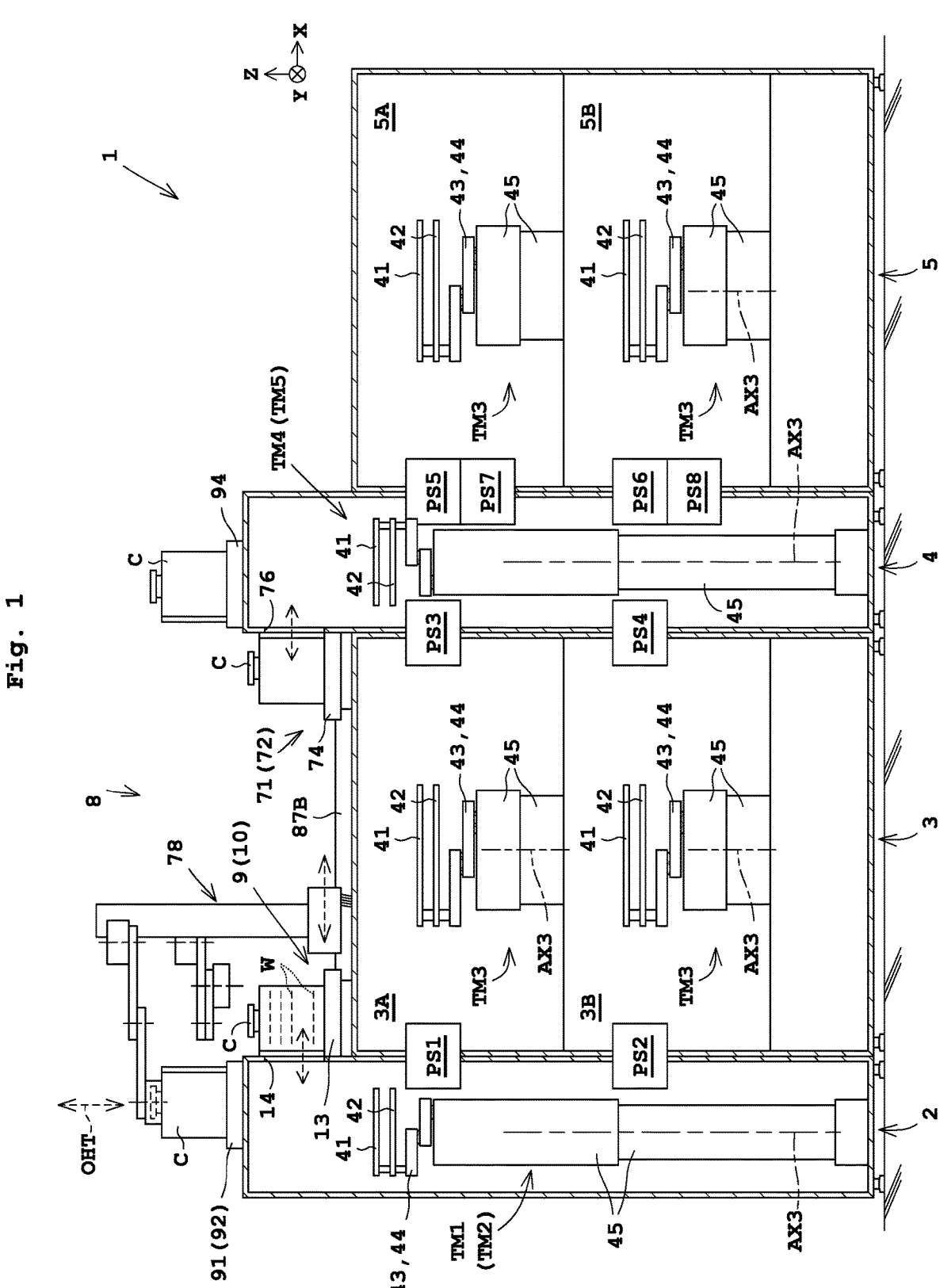
FIG. 1 is a longitudinal cross-sectional view of a substrate treating apparatus according to a first embodiment.
Figure 2:
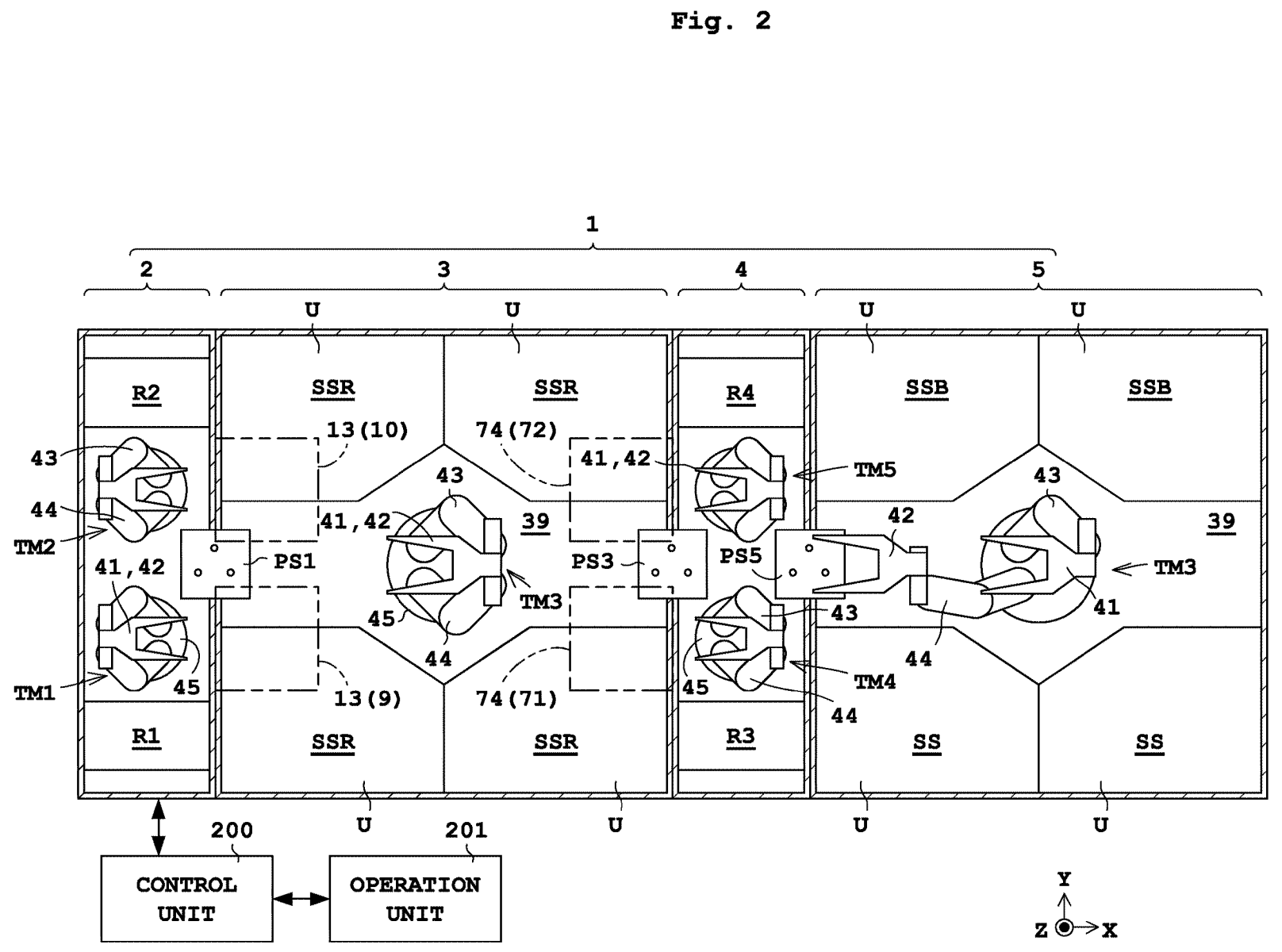
Figure 3:
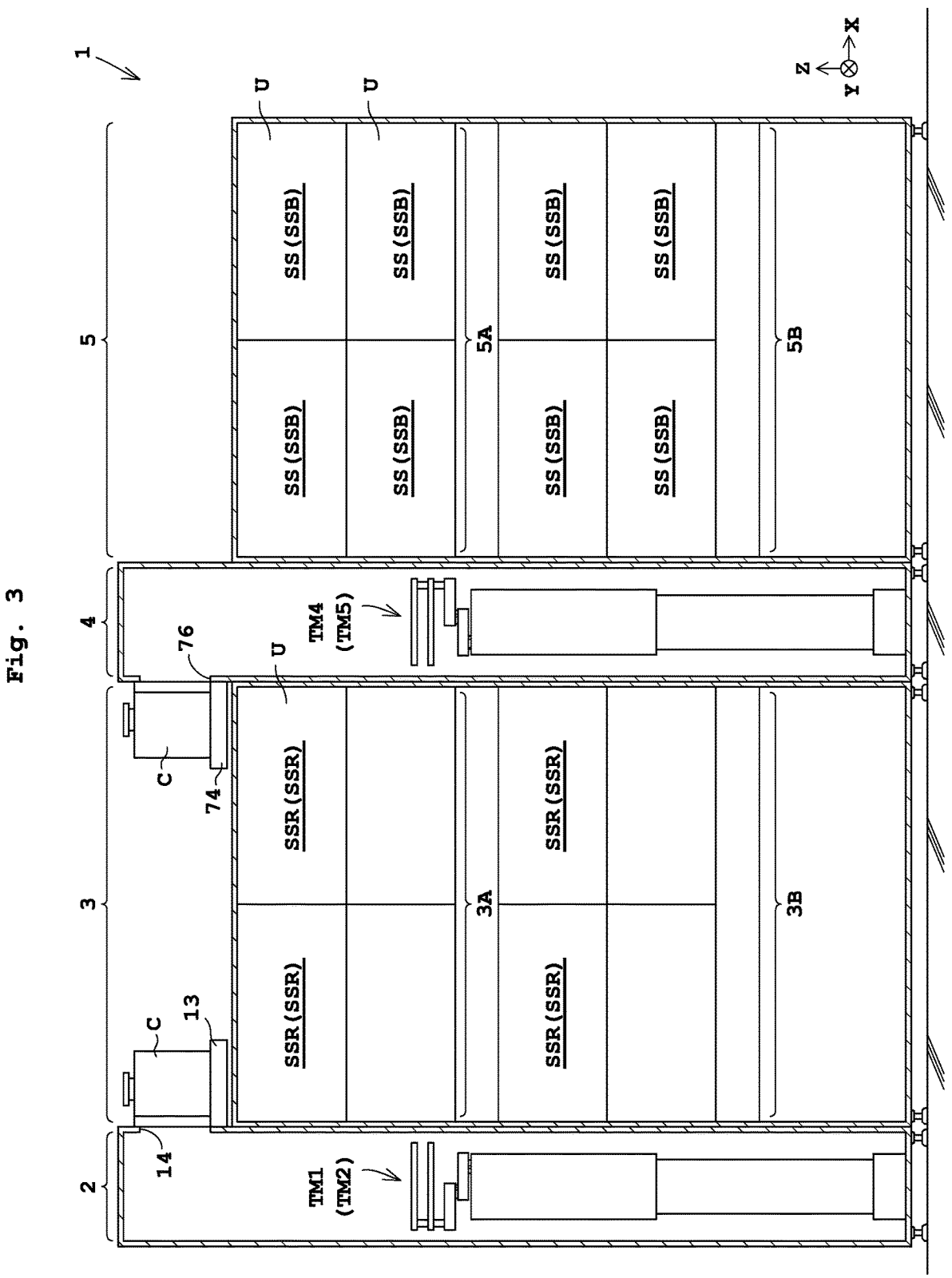
FIG. 3 is a right side view of the substrate treating apparatus according to the first embodiment.

A first embodiment of the present invention will now be described with reference to the drawings. In the following description, a face of a substrate where various patterns such as circuit patterns are formed is referred to as a front face, and a face opposite to the front face is referred to as a rear face. Moreover, a face of the substrate directed downwardly is referred to as a lower face, and a face the substrate directed upwardly is referred to as an upper face. FIG. 1 is a longitudinal cross-sectional view of a substrate treating apparatus 1 according to the first embodiment. FIG. 2 is a horizontal cross-sectional view of the substrate treating apparatus 1. FIG. 3 is a right side view of the substrate treating apparatus 1.

<Configuration of Substrate Treating Apparatus 1>

Reference is made to FIGS. 1 and 2. The substrate treating apparatus 1 includes a first indexer block (first ID block) 2, a first treating block 3, a second indexer block (second ID block) 4, a second treating block 5, a carrier buffer device 8. The first ID block 2, the first treating block 3, the second ID block 4, and the second treating block 5 are arranged in this order linearly.

[Configuration of First Indexer Block 2]

The first ID block 2 includes two openers 9, 10 (see FIGS. 2, 9), two inversion units R1, R2, and two substrate transport mechanisms (robots) TM1, TM2. The two openers (carrier mount tables) 9, 10 provided in the first ID block 2 each include a carrier C placed thereon.

The carrier C is capable of accommodating a plurality of (e.g., 25) substrates W in a horizontal orientation. For instance, a FOUP (Front Open Unified Pod) is used as the carrier C. Alternatively, a container except the FOUP (e.g., a Standard Mechanical Inter Face (SMIF) pod) is usable. The carrier C includes, for example, a carrier body with an opening formed therein through which the substrates W are inserted or taken out and configured to accommodate the substrates W, and a lid for covering the opening of the carrier body.

The openers 9, 10 each include a platform 13 on which the carrier C is placed, an opening 14 through which the substrates W pass, a shutter (not shown) configured to open and close the opening 14 and to attach and detach the lid to and from the carrier body, and a shutter drive mechanism (not shown) configured to drive the shutter. The shutter drive mechanism includes an electric motor. Here, the shutter detaches the lid from the carrier body, and thereafter, moves downwardly or horizontally with respect to the opening 14 (Y-direction), for example.

The platform 13 is provided on the roof of the first treating block 3. In FIG. 1, the platform 13 is provided higher in level than the first treating block 3, i.e., above the first treating block 3. The platform 13 may be provided on the first treating block 3, i.e., may contact an upper face of the first treating block 3. The platform 13 corresponds to a first carrier platform of the present invention.

Figure 4A:
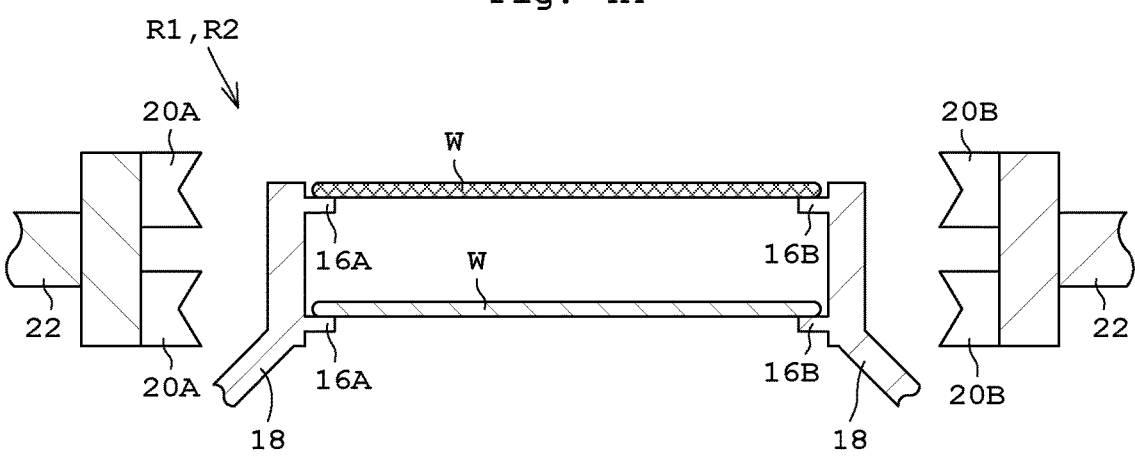
FIGS. 4A to 4C each illustrate an inversion unit.
Figure 4B:
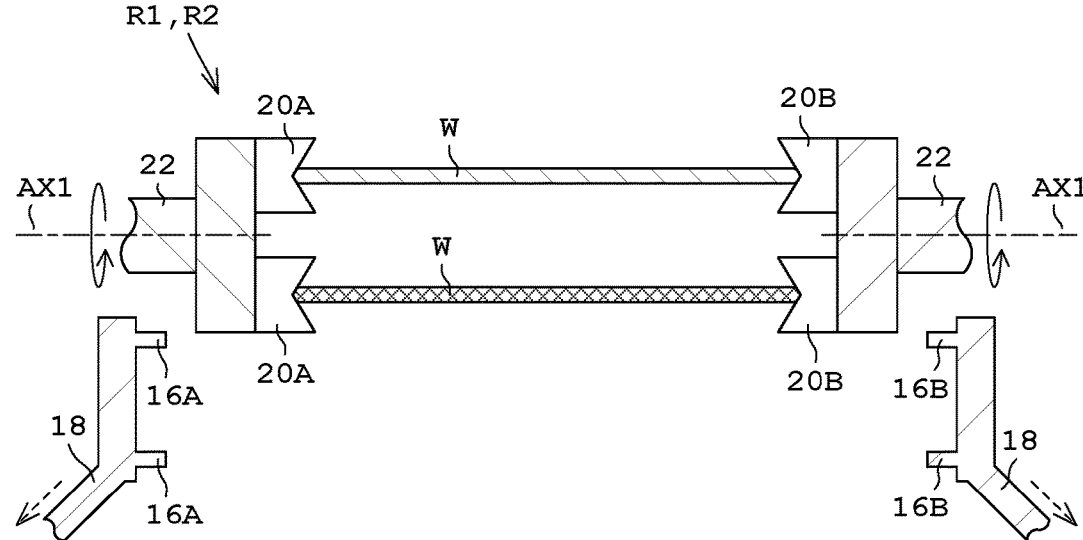
Figure 4C:
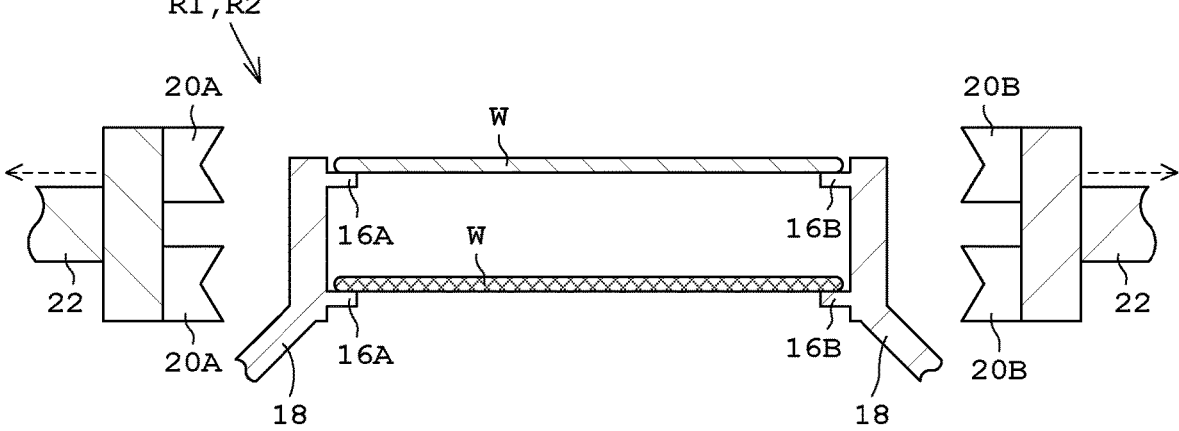

FIGS. 4A to 4C each illustrate a configuration and operation of the inversion units R1, R2. The inversion unit R1 includes the same configuration as that of the inversion unit R2.

As illustrated in FIG. 4A, the inversion units R1, R2 each include supporting members 16A, 16B, an oblique shaft 18, grasping members 20A, 20B, and a slide shaft 22. The supporting members 16A, 16B each include the oblique shaft 18 fixed thereon. An electric motor drives, whereby the supporting members 16A, 16B are moved along the oblique shaft 18. The grasping members 20A, 20B each include the slide shaft 22 fixed thereon. An electric motor drives, whereby the grasping members 20A, 20B are moved along the slide shaft 22 (along a horizontal axis AX1). Moreover, an electric motor drives, whereby the grasping members 20A, 20B are rotated around the horizontal axis AX1.

For instance, a first substrate transport mechanism TM1 transports a substrate W onto the two supporting members 16A, 16B of the inversion unit R1. In FIG. 4A, the supporting members 16A, 16B support two substrates W. Thereafter, as illustrated in FIG. 4B, the grasping members 20A, 20B grasp the substrates W in a horizontal direction. Accordingly, the grasping members 20A, 20B hold the two substrates W. Thereafter, the supporting members 16A, 16B are moved to a standby position along the oblique shaft 18 (see the arrow by dotted lines in FIG. 4B). The substrates W held with the grasping members 20A, 20B are reversed around the horizontal axis AX1. This causes change in direction of the front face of the substrate W from upwardly to downwardly. Moreover, when the front face of the substrate W is directed downwardly, this causes change in direction of the front face of the substrate W from downwardly to upwardly.

After the substrates W are reversed, the supporting members 16A, 16B are moved to a substrate placing position along the oblique shaft 18. Thereafter, as illustrated in FIG. 4C, the grasping members 20A, 20B are moved apart from the substrates W. Accordingly, the grasping members 20A, 20B release its holding, and thus the substrates W are placed on the supporting members 16A, 16B. The substrate transport mechanism TM1 is capable of transporting the substrate W from the inversion unit R1.

Reference is made to FIG. 1. The two substrate transport mechanisms TM1, TM2 each include two hands 41, 42, two articulated arms 43, 44, and a lifting/lowering rotation driving unit 45. The lifting/lowering rotation driving unit 45 is connected to the first hand 41 via the first articulated arm 43, and is connected to the second hand 42 via the second articulated arm 44. The lifting/lowering rotation driving unit 45 moves the two hands 41, 42, and the two articulated arms 43, 44 in the upward/downward direction (Z-direction), and rotates the hands 41, 42, and the articulated arms 43, 44 around a vertical axis AX3. Moreover, the lifting/lowering rotation driving unit 45 is fixed on a floor of treatment layers 3A, 3B, 5A, 5B individually so as not to move in the horizontal direction (especially, Y-direction). The articulated arms 43, 44 and the lifting/lowering rotation driving unit 45 each include an electric motor.

The substrate transport mechanisms TM1, TM2 are each capable of moving both the two hands 41 into the carrier C simultaneously. Moreover, the substrate transport mechanisms TM1, TM2 are each capable of moving the two hands 41 forward and backward individually. Accordingly, the substrate transport mechanisms TM1, TM2 are each capable of moving one of the two hands 41 into the carrier C.

A substrate platform PS1 is disposed between the first ID block 2 and an upper treatment layer 3A of the first treating block 3 mentioned later. Moreover, a substrate platform PS2 is disposed between the first ID block 2 and a lower treatment layer 3B of the first treating block 3 mentioned later. Each of the two substrate platforms PS1, PS2 and substrate platforms PS3 to PS8 mentioned later is capable of placing one or more substrates W thereon.

The first substrate transport mechanism TM1 takes a substrate W from the carrier C placed on a platform 13 of the opener 9, and transports the taken substrate W to any one of the two substrate platforms PS1, PS2 via the inversion unit R1. Moreover, the second substrate transport mechanism TM2 takes a substrate W from the carrier C placed on the platform 13 of the opener 10, and transports the taken substrate W to any one of the two substrate platforms PS1, PS2 via the inversion unit R2. Here, the first substrate transport mechanism TM1 is capable of taking the substrate W from the carrier C of the opener 9 and the inversion unit R1, but is incapable of taking the substrate W from the carrier C of the opener 10 and the inversion unit R2. Moreover, the second substrate transport mechanism TM2 is capable of taking the substrate W from the carrier C of the opener 10 and the inversion unit R2, but is incapable of taking the substrate W from the carrier C of the opener 9 and the inversion unit R1.

[Configuration of First Treating Block 3 and Second Treating Block 5]

The first treating block 3 is connected to the first ID block 2. The first treating block 3 performs a rear-face cleaning treatment on the substrates W. Moreover, the second treating block 5 is connected to the second ID block 4. The second treating block 5 performs an end-face cleaning treatment and a front-face cleaning treatment on the substrates W.

The first treating block 3 includes the two treatment layers 3A, 3B arranged in the upward/downward direction (Z-direction). The second treating block 5 includes the two treatment layers 5A, 5B arranged in the upward/downward direction. The four treatment layers 3A, 3B, 5A, 5B each include a third substrate transport mechanism TM3, a transportation space 39, and a plurality of treating units U. In FIG. 2, the third substrate transport mechanism TM3 is disposed in the transportation space 39. The treating units U are configured to surround the third substrate transport mechanism TM3.

The third substrate transport mechanism TM3 includes two hands 41, 42, two articulated arms 43, 44, and a lifting/lowering rotation driving unit 45. The third substrate transport mechanism TM3 is configured in the same manner as that of the first substrate transport mechanism TM1, and thus the description thereof is to be omitted.

Here, the two articulated arms 43, 44 allow the two hands 41, 42 to take two substrates W from the substrate platform PS1 simultaneously, or take one substrate W from the substrate platform PS1, for example.

In FIG. 2, the treating unit U adjacent to the second substrate transport mechanism TM2 and the treating unit U adjacent to the first substrate transport mechanism TM1 are disposed across the transportation space 39. The treating unit U adjacent to the first substrate transport mechanism TM1 is a unit on the right side of the substrate treating apparatus 1 in FIG. 3. The treating unit U on the right side in FIG. 3 is a unit to which a term "SSR" put in parentheses is not applied, for example. The treating unit U adjacent to the second substrate transport mechanism TM2 is a unit on the left side of the substrate treating apparatus 1. The treating unit U on the left side in FIG. 3 is a unit to which terms "SSR" or "SSB" put in parentheses are applied, for example.

The treating units U are arranged on the right and left sides in two lines in the horizontal direction and two levels in the upward/downward direction, that is, in 2 lines×2 levels, in each of the treatment layers 3A, 3B, 5A, 5B (see FIG. 3). The two treatment layers 3A, 3B of the first treating block 3 each include four rear-face cleaning units SSR. The two treatment layers 5A, 5B of the second treating block 5 each include four front-face cleaning units SS and four end-face cleaning units SSB.

Figures 5, 6:
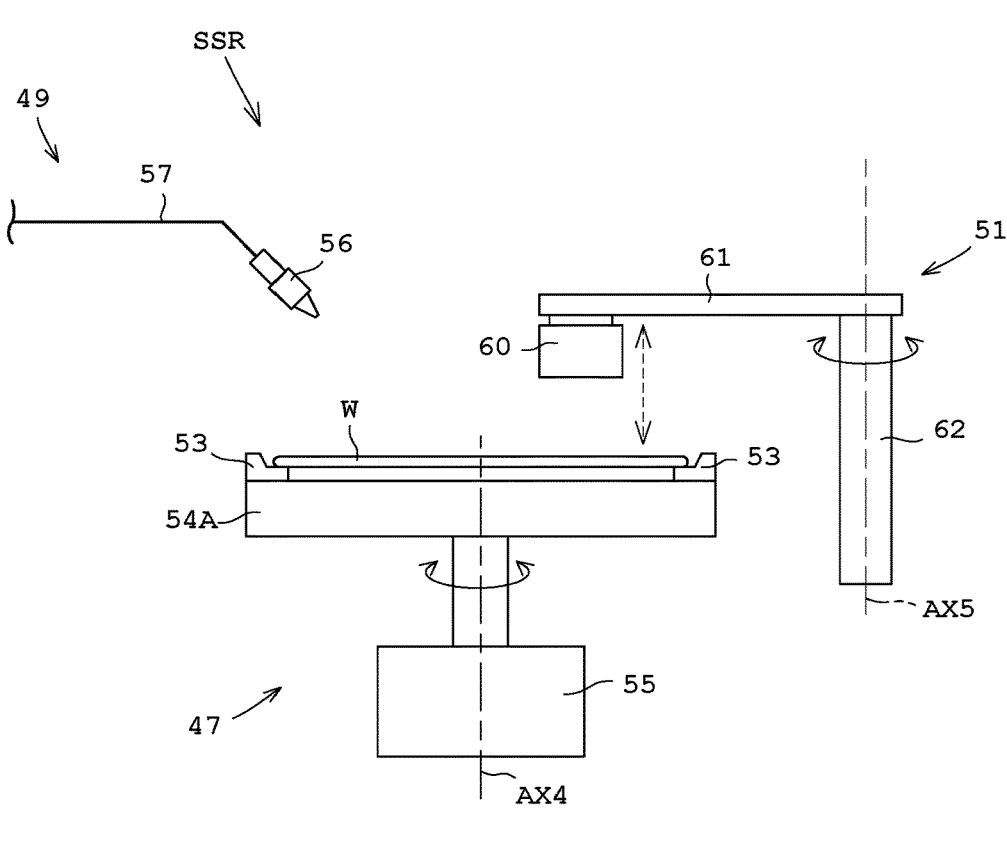
FIG. 5 illustrates a rear-face cleaning unit.
FIG. 6 illustrates a front-face cleaning unit.

FIG. 5 illustrates the rear-face cleaning unit SSR. The rear-face cleaning unit SSR performs a cleaning treatment with a brush (hereinafter, referred to as a scrub cleaning treatment) to clean the rear face of the substrate W. The rear-face cleaning unit SSR includes a holding rotation portion 47, a liquid supplying unit 49, and a brush cleaning mechanism 51.

The holding rotator 47 rotates the substrate W while holding the substrate W horizontally. The holding rotator 47 includes a spin chuck 54A that holds an end portion of the substrate W with a plurality of retaining pins 53, and a rotation drive unit 55 that is configured to rotate the spin chuck 54A around a rotation axis AX4 in the upward/downward direction. The spin chuck 54A includes a plurality of retaining pins 53. The rotation drive unit 55 includes an electric motor.

The liquid supplying unit 49 supplies a treating liquid to the substrate W. The liquid supplying unit 49 includes a nozzle 56, and a supplying pipe 57 in communication with the nozzle 56. The treating liquid is, for example, a cleaning liquid or a rinse liquid (deionized water). The liquid supplying pipe 57 may supply various types of treating liquids selectively to the nozzle 56. The nozzle 56 dispenses the treatment liquid supplied from the liquid supplying pipe 57 to the substrate W.

The brush cleaning mechanism 51 includes a brush cleaner 60, an arm 61, and a drive unit 62. The brush cleaner 60 contacts the substrate W directly, thereby cleaning the substrate W. The brush cleaner 60 is, for example, substantially cylindrical. The arm 61 includes a first end configured to support the brush cleaner 60 in a rotatable manner. The drive unit 62 includes an electric motor. The drive unit 62 is connected to a second end of the arm 61 to rotate the arm 61 around a vertical axis AX5 and move the arm 61 in the upward/downward direction.

The rear-face cleaning unit SSR operates as under. When the substrates W reversed by the inversion units R1, R2 are placed on the holding rotator 47, the holding rotator 47 holds the substrates W. Thereafter, the holding rotator 47 rotates while holding the substrate W in a horizontal attitude. The liquid supplying unit 49 supplies the treating liquid to the upper face of the substrate W. The brush cleaning mechanism 51 contacts the brush cleaner 60 directly to the upper face of the substrate W. The substrates W are cleaned with the treating liquid and the brush cleaner 60. At this time, the brush cleaner 60 may swing while contacting the substrate W directly. Alternatively, the rear-face cleaning unit SSR may perform a cleaning treatment without the brush cleaner 60 but with the treating liquid only.

FIG. 6 illustrates the front-face cleaning unit SS. The front-face cleaning unit SS cleans the front face of the substrate W. The front-face cleaning unit SS includes a holding rotation portion 47, a liquid supplying unit 49, and a spray cleaning mechanism 52. The holding rotator 47 includes a spin chuck 54B configured to hold the rear face of the substrate W through vacuum-suction, for example. The liquid supplying unit 49 has basically the same configuration as the rear-face cleaning unit SSR in FIG. 5. The spray cleaning mechanism 52 includes a spray nozzle (binary nozzle) 58, and a liquid supplying pipe 59 in communication with the spray nozzle 58. The treating liquid as well as nitrogen gas (inert gas) are supplied to the spray nozzle 58 via the liquid supplying pipe 59. The holding rotator 47 rotates the held substrates W. The nozzle 56 dispenses the treating liquid to the upper face of the rotating substrate W. The spray nozzle 58 sprays droplets of the treating liquid to the upper face of the rotating substrate W. Here, the front-face cleaning unit SS may include the spin chuck 54A in FIG. 5 instead of the spin chuck 54B.

FIG. 7 illustrates the end-face cleaning unit SSB. The end-face cleaning unit SSB includes a holding rotation portion 47 that holds a substrate W and rotates the held substrate W, and an end-face cleaning mechanism 64 configured to clean the end face of the substrate W. The holding rotator 47 has substantially the same configuration as the holding rotator 47 in FIGS. 5, 6. The end-face cleaning mechanism 64 is configured to move horizontally between a cleaning position and a standby position. The end-face cleaning mechanism 64 includes a substantially cylindrical brush 66 and two nozzles 67, 68. The brush 66 is supported in a rotatable manner around a vertical axis AX6. The nozzle 67 supplies a cleaning liquid from an upper face side of the substrate W. The nozzle 68 supplies a cleaning liquid from a lower face side of the substrate W.

When the substrates W are placed on the holding rotator 47, the holding rotator 47 holds the substrates W. Thereafter, the end-face cleaning mechanism 64 is moved from the standby position to the cleaning position. The brush 66 of the end-face cleaning mechanism 64 contacts the end portion of the rotating substrate W, the brush 66 cleans the end portion of the substrate W. During the cleaning treatment, the two nozzles 67, 68 supply the treating liquids.

[Configuration of Second Indexer Block 4]

Reference is made to FIG. 1. The second ID block 4 is connected to the first treating block 3 and the second treating block 5. That is, the second ID block 4 is disposed between the first treating block 3 and the second treating block 5.

The second ID block 4 includes two openers 71, 72 (see FIGS. 2, 9), two inversion units R3, R4, and two substrate transport mechanisms TM4, TM5. The two openers 71, 72 provided in the second ID block 4 each include a carrier C placed thereon that is capable of accommodating a plurality of substrates W.

Similarly to the opener 9, the openers 71, 72 each include a platform 74 on which the carrier C is placed, an opening 76 through which the substrates W pass, a shutter (not shown) configured to open and close the opening 76 and to attach and detach the lid to and from the carrier body, and a shutter drive mechanism configured to drive the shutter. The shutter drive mechanism includes an electric motor. Here, the shutter detaches the lid from the carrier body, and thereafter, moves downwardly or horizontally with respect to the opening 76 (Y-direction), for example.

The platform 74 is provided on the roof of the first treating block 3. In FIG. 1, the platform 74 is provided higher in level than the first treating block 3, i.e., above the first treating block 3. The platform 74 may be provided on the first treating block 3, i.e., may contact the first treating block 3. The platform 74 corresponds to the second carrier platform of the present invention.

The inversion units R3, R4 each have substantially the same configuration as that of the inversion unit R1 in FIG. 4A. The substrate transport mechanisms TM4, TM5 each include two hands 41, 42, two articulated arms 43, 44, and a lifting/lowering rotation driving unit 45. The substrate transport mechanisms TM4, TM5 are each configured in the same manner as that of the substrate transport mechanism TM1 (TM2).

A substrate platform PS3 is disposed between the upper treatment layer 3A and the second ID block 4. A substrate platform PS4 is disposed between the lower treatment layer 3B and the second ID block 4. Two substrate platforms PS5, PS7 are disposed between the second ID block 4 and the upper treatment layer 5A. Moreover, two substrate platforms PS6, PS8 are disposed between the second ID block 4 and the lower treatment layer 5B.

The fourth substrate transport mechanism TM4 transports a substrate W among the six substrate platforms PS3 to PS8. Moreover, the fourth substrate transport mechanism TM4 is capable of taking and delivering a substrate W from and into the carrier C placed on the opener 71 (see FIG. 9) and the inversion unit R3. However, the fourth substrate transport mechanism TM4 is incapable of taking and delivering a substrate W from and into the carrier C placed on the opener 72 and the inversion unit R4.

The fifth substrate transport mechanism TM5 transports a substrate W among the six substrate platforms PS3 to PS8. Moreover, the fifth substrate transport mechanism TM5 is capable of taking and delivering a substrate W from and into the carrier C placed on the opener 72 (see FIG. 9) and the inversion unit R4. However, the fifth substrate transport mechanism TM5 is incapable of taking and delivering a substrate W from and into the carrier C placed on the opener 71 and the inversion unit R3.

[Carrier Buffer Device 8]

The substrate treating apparatus 1 includes a carrier buffer device 8 placed on or above the first ID block 2, the first treating block 3 and the second ID block 4, for example. The carrier buffer device 8 includes a carrier transport mechanism 78 and a carrier storage shelf 79 (see FIG. 9).

Reference is made to FIG. 8. FIG. 8 illustrates the carrier transport mechanism 78. The carrier transport mechanism 78 includes two articulated arms 81, 82. The first articulated arm 81 includes a first end with a gripper 83, and the second articulated 82 includes a first end with a gripper 84. Moreover, the first articulated arm 81 includes a second end supported on a strut lifting/lowering driving unit 85 so as to be movable in the upward/downward direction. The second articulated arm 82 includes a second end supported on the lifting/lowering driving unit 85 so as to be movable in the upward/downward direction.

Each of the two grippers 83, 84 is configured to grasp a projection provided on a top face of the carrier C, for example. The two grippers 83, 84 each include an electric motor.

The two articulated arms 81, 82 each include one electric motor or two or more electric motors. The first articulated arm 81 is configured to cause the first gripper 83 to be rotatable to 360 degrees about a vertical axis AX7. The second articulated arm 82 is configured in the same manner as the first articulated arm 81. For instance, the first articulated arm 81 may be in charge of transporting the carrier C adjacent to the openers 10, 72 in FIG. 9, whereas the second articulated arm 82 may be in charge of transporting the carrier C adjacent to the openers 9, 71 in FIG. 9.

The lifting/lowering driving unit 85 is configured to cause the two articulated arms 81, 82 to be liftable individually. The lifting/lowering driving unit 85 includes an electric motor. The lifting/lowering driving unit 85 may include a belt and two or more pulleys, for example, for one articulated arm.

A forward/backward driving unit 87 includes a supporting portion 87A configured to support the lifting/lowering driving unit 85, a longitudinal portion 87B extending longitudinally in the forward/rearward direction (X-direction), and an electric motor (not shown). For instance, the longitudinal portion 87B may be a rail (guide rail) and the supporting portion 87A may be a carriage. In this case, the electric motor may be configured to cause the carriage (supporting portion 87A) to move along the rail (longitudinal portion 87B).

Moreover, the electric motor, the two or more pulleys, and the belt may be accommodated in the longitudinal portion 87B, and the supporting portion 87A may be fixed to the belt, for example. In this case, the electric motor may cause the pulleys to rotate to move the belt on the pulleys, whereby supporting portion 87A is moved.

Reference is made to FIG. 9. The carrier storage shelf 79 includes input ports 91, output ports 92, untreated substrate carrier shelves 93, empty carrier shelves 94, and treated substrate carrier shelves 95. The input ports 91 are each a shelf for receiving the carrier C where untreated substrates W are accommodated from an external transport mechanism OHT (Overhead Hoist Transport). The external transport mechanism OHT transports a carrier C in the factory. The term "untreated" means the condition where at least neither the first treating block 3 nor the second treating block 5 performs any treatment on the substrate. As illustrated in FIGS. 1 and 9, the input port 91 is provided on the ID block 2, i.e., on the roof of the ID block 2. A rail 97 for the external transport mechanism OHT is provided above the ID block 2. The external transport mechanism OHT transports a carrier C to one of the two input ports 91.

Moreover, as illustrated in FIG. 9, the untreated substrate carrier shelves 93, the empty carrier shelves 94, and the treated substrate carrier shelves 95 are arranged along the longitudinal portion 87B in a longitudinal direction of the substrate treating apparatus 1. The untreated substrate carrier shelf 93 accommodates a carrier C which was placed on the input port 91, not transported to either of the two platforms 13, and accommodating untreated substrates W. The empty carrier shelf 94 accommodates a carrier C from which all the substrates W are taken out on the platform 13, and which was not transported to either of the two platforms 74. The treated substrate carrier shelf 95 accommodates a carrier C accommodating the treated substrates W and not transported to either of the two output ports 92. The term "treated" means the condition where at least either the first treating block 3 or the second treating block 5 performs any treatment on the substrate.

The output port 92 is a shelf for delivering a carrier C where the treated substrates W are accommodated to the external transport mechanism OHT. As illustrated in FIGS. 1 and 9, the output port 92 is provided on the ID block 2, i.e., on the roof of the ID block 2. The carrier transport mechanism 78 allows a carrier C to move freely among the platforms 13, 74 and the shelves 91 to 95.

Moreover, as illustrated in FIGS. 1 and 9, the platform 13 and the opening 14 (openers 9, 10) are disposed adjacent to the first treating block 3, and the platform 74 and the opening 76 (openers 71, 72) are disposed adjacent to the first treating block 3. In other words, the platform 13 and the platform 74 are disposed so as to face each other. Accordingly, the platform 13 and the platform 74 face the carrier transport mechanism 78, whereby the carrier transport mechanism 78 can transport the carrier C easily. Moreover, if the platform is disposed opposite to the first treating block 3 (see the arrow AR1 in FIG. 9) across the ID block 2 in a currently-used manner, the platform 13 protrudes, for example. In contrast to this, since the platform 13 and the platform 74 are disposed so as to face each other, protrusion of the platform 13 can be prevented. As a result, reduction in footprint of the substrate treating apparatus 1 is obtainable.

The carrier transport mechanism 78 includes the two-paired articulated arms and grippers. Alternatively, one-paired articulated arm and gripper and three or more paired articulated arms and grippers may be provided. Moreover, the lifting/lowering driving unit 85 may be configured to be rotatable about a vertical axis with respect to the supporting portion 87A. Moreover, a rail 97 may pass an area other than the area above the first ID block 2. In this case, an input port 91 and an output port 92 are provided at a position on the apparatus 1 where the external transport mechanism OHT passes above the apparatus 1. The number and types of the carrier storage shelves 79 are variable where appropriate.

Moreover, as illustrated in FIG. 2, the substrate treating apparatus 1 includes one or more control units 200 and an operation unit 201. Each of the control units 200 includes, for example, a central processing unit (CPU). The control units 200 control components of the substrate treating apparatus 1. The operation unit 201 includes a display unit (e.g., liquid crystal monitor), a memory unit, and an input unit. The memory unit includes, for example, at least one of a read-only memory (ROM), random-access memory (RAM), and a hard disk. The input unit includes at least one of a keyboard, a mouse, a touch panel, and various buttons. The memory unit stores conditions for substrate treatments and operation programs necessary for controlling the substrate treating apparatus 1.

<Operation of Substrate Treating Apparatus 1>

An operation of the substrate treating apparatus 1 will now be described. Reference is made to FIG. 1. The external transport mechanism OHT transports a carrier C to the input ports 91 provided on the first ID block 2. The carrier transport mechanism 78 transports the carrier C from the input port 91 to the platform 13 of the opener 9, for example. The shutter of the opener 9 opens the opening 14 while removing and holding the lid of the carrier C.

[Step S01] First ID Block 2

The first ID block 2 takes a substrate W from the carrier C placed on the carrier platform 13 of one of the two openers 9, 10, and sends the taken substrate W to one of the two treatment layers 3A, 3B in the first treating block 3. Detailed description is as under.

For instance, the first substrate transport mechanism TM1 takes a substrate W from the carrier C placed on the platform 13 of the opener 9, and transports the taken substrate W to the inversion unit R1. The substrate W is accommodated into the carrier C while the front face thereof is directed upwardly. Accordingly, the inversion unit R1 causes the front face of the substrate W to change from an upward direction to a downward direction. In other words, the rear face of the substrate W is directed upwardly.

The first substrate transport mechanism TM1 transports the inversed substrate W to one of the two substrate platforms PS1, PS2. For instance, the first substrate transport mechanism TM1 transports the inversed substrate W to the two substrate platforms PS1, PS2 alternately. Here, the second substrate transport mechanism TM2 transports the substrate W to the inversion unit R2.

When all the substrates W are taken from the carrier C, the opener 9 closes the opening 14 with the shutter while attaching the lid to the carrier C. Thereafter, the carrier transport mechanism 78 replaces the empty carrier C, from which the substrates W are taken out, by another carrier C accommodating untreated substrates W. Thereafter, the carrier transport mechanism 78 transports the empty carrier C to the platform 74 of the opener 71, for example. If the empty carrier C is incapable of being transported to either the opener 71 or 72, the carrier transport mechanism 78 transports the empty carrier C to the empty carrier shelf 94.

[Step S02] First Treating Block 3

The first treating block 3 performs a rear-face cleaning treatment on the substrate W sent from the first ID block 2, and sends the substrate W subjected to the rear-face cleaning treatment to the second ID block 4.

In the treatment layer 3A of the first treating block 3, for example, the third substrate transport mechanism TM3 receives a substrate W from the substrate platform PS1. The third substrate transport mechanism TM3 transports the received substrate W to one of the four rear-face cleaning units SSR. The rear-face cleaning unit SSR performs a rear-face cleaning treatment on the substrate W whose rear face is directed upwardly. The third substrate transport mechanism TM3 transports the substrate W, subjected to the rear-face cleaning treatment, to the substrate platform PS3. Moreover, the same treatment is performed in the treatment layer 3B as in the treatment layer 3A.

[Step S03] Second ID Block 4

The second ID block 4 sends the substrate W, subjected to the rear-face cleaning treatment and sent from the first treating block 3, to any of the two treatment layers 5A, 5B in the second treating block 5.

For instance, the fourth substrate transport mechanism TM4 receives the substrate W from the substrate platform PS3, and sends the received substrate W to the inversion unit R3. The inversion unit R3 causes the front face of the substrate W to change from the downward direction to the upward direction. The fourth substrate transport mechanism TM4 transports the inversed substrate W to the substrate platform PS5. Here, the fifth substrate transport mechanism TM5 transports the substrate W to the inversion unit R4.

Specifically, in general, when the second ID block 4 receives the substrate W from the substrate platform PS3, the received substrate W is transported to the substrate platform PS5. Moreover, when the second ID block 4 receives the substrate W from the substrate platform PS4, the received substrate W is transported to the substrate platform PS6. Regarding such a transportation method, when the second ID block 4 receives the substrate W from the substrate platform PS3, the received substrate W may be transported to the substrate platform PS6. Moreover, when the second ID block 4 receives the substrate W from the substrate platform PS4, the received substrate W may be transported to the substrate platform PS5.

[Step S04] Second Treating Block 5

The second treating block 5 performs an end-face cleaning treatment and a front-face cleaning treatment on the substrate W sent from the second ID block 4, and returns the substrate W subjected to these treatments to the second ID block 4.

In the treatment layer 5A of the second treating block 5, for example, the third substrate transport mechanism TM3 receives a substrate W from the substrate platform PS5. The third substrate transport mechanism TM3 transports the received substrate W to one of the four end-face cleaning units SSB. The end-face cleaning unit SSB performs the end-face cleaning treatment on the substrate W whose front face is directed upwardly. The third substrate transport mechanism TM3 transports the substrate W, subjected to the end-face cleaning treatment, to one of the four front-face cleaning units SS. The front-face cleaning unit SS performs the front-face cleaning treatment on the substrate W. The third substrate transport mechanism TM3 transports the substrate W, subjected to the end-face cleaning treatment and the front-face cleaning treatment, to the substrate platform PS7. Moreover, the same treatments are performed in the treatment layer 5B as in the treatment layer 5A.

[Step S05] Second ID Block 4

The second treating block 5 performs the end-face cleaning treatment and the front-face cleaning treatment. The second ID block 4 returns the substrate W, sent from the second treating block 5, to a carrier C placed on the platform 74 of the opener 71.

The carrier C on the platform 74 includes the opening kept in an opened state by the opener 71. The fourth substrate transport mechanism TM4 receives the substrate W from the substrate platform PS7 (PS8) for return, and returns the received substrate W to the carrier C placed on the platform 74 of the opener 71. Here, the substrate W is returned to the carrier C where the substrate W was accommodated prior to the rear-face cleaning treatment, the end-face cleaning treatment, and the surface cleaning treatment. In other words, the substrate W is returned to the first carrier C. Moreover, the substrate W is returned to the carrier C on the platform 74 of the opener 72 with use of the fifth substrate transport mechanism TM5.

When all the treated substrates W are accommodated in the carrier C, the opener 71 closes the opening 76 while attaching the lid to the carrier C. The carrier transport mechanism 78 transports the carrier C where the treated substrates W are accommodated from the platform 74 of the opener 71 to the output port 92. Thereafter, the external transport mechanism OHT transports the carrier C from the output port 92 to a next target.

FIG. 10 illustrates operation of a currently-used substrate treating apparatus 101. The currently-used substrate treating apparatus 101 transports a substrate W to an ID block 102, a first treating block 103, a second treating block 105 in this order (forward path FW). Moreover, the substrate treating apparatus 101 transports a substrate W to the second treating block 105, the first treating block 103, the ID block 102 in this order (return path RT). During the transportation, the second treating block 105 performs a second cleaning treatment, and the first treating block 103 performs a first cleaning treatment.

According to this embodiment, the first ID block 2, the first treating block 3, the second ID block 4, and the second treating block 5 are arranged in this order as in FIG. 11. A platform 13 is disposed on a first ID block 2, and a platform 74 is placed on a second ID block 4. As illustrated in FIG. 10, the currently-used carrier platform 113 is placed only on the ID block 102. Accordingly, the substrate W is transported in both the forward path and the return path between the ID block 102 and the second treating block 105. According to this embodiment, the substrate W is returned not to the first ID block 2 but to the second ID block 4 disposed between the two treating blocks 3, 5 in the return path. Consequently, transportation process by the first treating block 3 disposed between the first ID block 2 and the second ID block 4 is reduced in the return path (see the numeral AR2 in FIG. 11). As a result, an entire throughput of a substrate treating apparatus 1 can be enhanced.

Moreover, the substrate treating apparatus 1 includes the carrier transport mechanism 8 configured to transport a carrier C between the platform 13 and the platform 74 as in FIG. 1. For instance, when all the substrates W are taken from the carrier C placed on the platform 13, the carrier transport mechanism 8 is capable of transporting the carrier C placed on the platform 13 to the platform 74 in order to return the substrates W to the carrier C.

Moreover, the carrier transport mechanism 8 is mounted on the first treating block 3. The currently-used carrier transport mechanism is disposed horizontally with respect to the first ID block 2. With the configuration of this embodiment, the carrier transport mechanism 8 is mounted on the first treating block 3. Accordingly, an installation area of the currently-used carrier transport mechanism disposed horizontally with respect to the first ID block 2 can be decreased. In other words, reduction in footprint of the substrate treating apparatus 1 is obtainable.

Moreover, the substrate treating apparatus 1 includes the carrier storage shelf 79 mounted on the first ID block 2, the first treating block 3, and the second ID block 4. The carrier transport mechanism 78 transports a carrier C among the platforms 13, 74 and the carrier storage shelf 79. A currently-used carrier storage shelf 79 is disposed horizontally with respect to the ID block 2. With the configuration of this embodiment, the carrier storage shelf 79 is mounted on the first treating block 3, for example. Accordingly, an installation area of the currently-used carrier storage shelf disposed horizontally with respect to the ID block 2 can be decreased. In other words, reduction in footprint of the substrate treating apparatus 1 is obtainable.

Second Embodiment

A second embodiment of the present invention will now be described with reference to the drawings. Here, the description common to that of the first embodiment is to be omitted.

In the first embodiment, the substrate treating apparatus 1 takes a substrate W from the carrier C placed on the platform 13 of the first ID block 2 illustrated on the left side of FIG. 1, and accommodates the substrate W into the carrier C placed on the platform 74 of the second ID block 4 illustrated on the right side of FIG. 1. In this regard, such tasks of are replaceable with each other. That is, the substrate treating apparatus 1 may take a substrate W from the carrier C placed on the platform 74 of the second ID block 4 illustrated on the right side of FIG. 1, and may accommodate the substrate W into the carrier C placed on the platform 13 of the first ID block 2 illustrated on the left side of FIG. 1.

FIG. 12 is a horizontal cross-sectional view of a substrate treating apparatus 1 according to the second embodiment. FIG. 13 is a right side view of the substrate treating apparatus 1 according to the second embodiment. The substrate treating apparatus 1 according to this embodiment includes the configuration of the treating units U of the first treating block 3 and the second treating block 5 illustrated in a reversed manner from that of the substrate treating apparatus 1 in FIGS. 2 and 3 according to the first embodiment.

The two treatment layers 3A, 3B of the first treating block 3 each include four front-face cleaning units SS and four end-face cleaning units SSB. Moreover, the two treatment layers 5A, 5B of the second treating block 5 each include four rear-face cleaning units SSR. Moreover, as illustrated in FIG. 12, the two inversion units R1, R2 are not provided in the first ID block 2.

<Operation of Substrate Treating Apparatus 1>

An operation of the substrate treating apparatus 1 according to this embodiment will now be described. FIG. 14 illustrates operation of the substrate treating apparatus 1. As illustrated in FIG. 14, the two treating blocks 3, 5 are each configured in a single treatment layer for easy description of its operation.

Reference is made to FIG. 14. The second ID block 4 takes a substrate W from the carrier C placed on a platform 74 of one of the two openers 71, 72 (see FIG. 12), and sends the taken substrate W to the second treating block 5. When the substrate W is sent to the second treating block 5, one of the inversion units R3, R4 causes the substrate W to inverse for change in direction of a front face of the substrate W from an upward direction to a downward direction. In other words, the rear face of the inversed substrate W is directed upwardly. The second ID block 4 sends the inversed substrate W to the second treating block 5.

The second treating block 5 performs a rear-face cleaning treatment on the substrate W sent from the second ID block 4, and returns the substrate W subjected to the rear-face cleaning treatment to the second ID block 4.

The second ID block 4 sends the substrate W, sent from the second treating block 5, to the first treating block 3. When the substrate W is sent to the first treating block 3, one of the two inversion units R3, R4 causes the substrate W to inverse for change in direction of the front face of the substrate from the downward direction to the upward direction. The second ID block 4 sends the inversed substrate W to the first treating block 3.

The first treating block 3 performs an end-face cleaning treatment and a front-face cleaning treatment on the substrate W sent from the second ID block 4, and sends the substrate W subjected to the end-face cleaning treatment and the front-face cleaning treatment back to the first ID block 2.

The first ID block 2 returns the substrate W, sent from the first treating block 3, to a carrier C placed on the platform 13 on any of the two openers 9, 10 (see FIG. 12).

According to this embodiment, the platform 13 is disposed on the first ID block 2, and the platform 74 is placed on the second ID block 4. A currently-used carrier platform is provided only on the first ID block 2. Accordingly, the substrate W is transported in both the forward path and the return path between the first ID block 2 and the second treating block 5. According to this embodiment, transportation of the substrate W starts not from the first ID block 2 but from the second ID block 4 disposed between the two treating blocks 3, 5 in the forward path. Consequently, transportation process in the forward path by the first treating block 3 disposed between the first ID block 2 and the second ID block 4 is reduced (see the numeral AR2 in FIG. 14). As a result, an entire throughput of a substrate treating apparatus 1 can be enhanced.

Third Embodiment

A third embodiment of the present invention will now be described with reference to the drawings. Here, the description common to that of the first and second embodiments is to be omitted.

In the first embodiment, the substrate treating apparatus 1 takes a substrate W from the carrier C placed on the platform 13 of the first ID block 2 illustrated on the left side of FIG. 1, and accommodates the substrate W into the carrier C placed on the platform 74 of the second ID block 4 illustrated on the right side of FIG. 1. At this time, the first treating block 3 performs the rear-face cleaning treatment, and the second treating block 5 performs the end-face cleaning treatment and the front-face cleaning treatment. In this regard, the first treating block 3 may perform the end-face cleaning treatment and the front-face cleaning treatment, and the second treating block 5 may perform the rear-face cleaning treatment.

The substrate treating apparatus 1 in this embodiment includes the same configuration as that of the substrate treating apparatus 1 in the second embodiment in FIGS. 12, 13.

<Operation of Substrate Treating Apparatus 1>

FIG. 15 illustrates operation of the substrate treating apparatus 1. As illustrated in FIG. 15, the two treating blocks 3, 5 are each configured in a single treatment layer for easy description of its operation.

Reference is made to FIG. 15. The first ID block 2 takes a substrate W from the carrier C placed on the platform 13 of one of the two openers 9, 10, and sends the taken substrate W to the first treating block 3. At this time, the first ID block 2 sends the substrate W, whose front face is directed upwardly, to the first treating block 3.

The first treating block 3 performs an end-face cleaning treatment and a front-face cleaning treatment on the substrate W sent from the first ID block 2, and sends the substrate W subjected to the end-face cleaning treatment and the front-face cleaning treatment to the second ID block 4.

The second ID block 4 transports the substrate W, sent from the first treating block 3, to the second treating block 5. When the substrate W is sent to the second treating block 5, one of the two inversion units R3, R4 causes the substrate W to inverse for change in direction of a front face of the substrate W from an upward direction to a downward direction. In other words, the rear face of the inversed substrate W is directed upwardly. The second ID block 4 sends the inversed substrate W to the second treating block 5.

The second treating block 5 performs a rear-face cleaning treatment on the substrate W sent from the second ID block 4 and whose rear face is directed upwardly, and returns the substrate W subjected to the rear-face cleaning treatment to the second ID block 4.

The second ID block 4 returns the substrate W, sent from the second treating block 5, to a carrier C on the platform 74 placed on any of the two openers 71, 72 (see FIG. 12). When the substrate W is returned to the carrier C, one of the two inversion units R3, R4 causes the substrate W to inverse for change in direction of the front face of the substrate W from the downward direction to the upward direction. The second ID block 4 returns the substrate W, whose front face is inversed to be directed upwardly, to the carrier C.

The substrate treating apparatus 1 according to this embodiment produces the same effect as that of the first embodiment. Thus, transportation process by the first treating block 3 disposed between the first ID block 2 and the second ID block 5 is reduced in the return path. As a result, an entire throughput of a substrate treating apparatus 1 can be enhanced.

This invention is not limited to the foregoing examples, but may be modified as follows.

(1) In the second embodiment described above, the substrate treating apparatus 1 takes a substrate W from the carrier C placed on the platform 74 of the second ID block 4 illustrated on the right side of FIG. 14, and accommodates the substrate W into the carrier C placed on the platform 13 of the first ID block 2 illustrated on the left side of FIG. 14. At this time, the first treating block 3 performs the end-face cleaning treatment and the front-face cleaning treatment, and the second treating block 5 performs the rear-face cleaning treatment. In this regard, the first treating block 3 may perform the rear-face cleaning treatment, and the second treating block 5 may perform the end-face cleaning treatment and the front-face cleaning treatment.

The substrate treating apparatus 1 in this modification includes the same configuration as that of the substrate treating apparatus 1 in the first embodiment in FIGS. 1 to 3. In the substrate treating apparatus 1 in this modification, the second ID block 4 in FIG. 16 takes the substrate W from the carrier C placed on the platform 74. The second treating block 5 performs the end-face cleaning treatment and the front-face cleaning treatment on the taken substrate, and the first treating block 3 performs the rear-face cleaning treatment on the substrate W. Thereafter, the substrate W is transported to the first ID block 2. The first ID block 2 returns the substrate W, sent from the first treating block 3, to the carrier C on the platform 74.

(2) In the above embodiments and the modification (1), the two treatment layers 3A, 3B of the first treating block 3 each include treating units U in two lines in the X-direction, as in FIG. 3. In this regard, one line or three or more lines are applicable, as illustrated in FIG. 17. Moreover, the two treatment layers 3A, 3B each include treating units U in two levels in the Z-direction, as in FIG. 3. In this regard, one level or three or more levels are applicable. Moreover, the lifting/lowering rotation driving unit 45 of the third substrate transport mechanism TM3 is fixed on a floor of treatment layers 3A, 3B, 5A, 5B individually. In this regard, the lifting/lowering rotation driving unit 45 of the third substrate transport mechanism TM3 may be configured so as to be movable in the X-direction with drive by the electric motor.

(3) In the above embodiments and modifications, one of the first treating block 3 and the second treating block 5 include the end-face cleaning unit SSB. In this regard, the end-face cleaning unit SSB is not necessarily disposed where appropriate. Moreover, one of the first treating block 3 and the second treating block 5 may include the front-face cleaning unit SS, and the other thereof may include the end-face cleaning unit SSB where appropriate. Moreover, one of the first treating block 3 and the second treating block 5 may include the rear-face cleaning unit SSR, and the other thereof may include the end-face cleaning unit SSB.

(4) In the above embodiments and modifications, the first treating block 3 and the second treating block 5 include the rear-face cleaning unit SSR, the front-face cleaning unit SS and the end-face cleaning unit SSB. However, this is not limitative to the treating unit U. For instance, one of the treating blocks may include a treating unit U configured to perform a bevel cleaning (etching) treatment, whereas the other of the treating blocks may include a treating unit U configured to perform a rear-face cleaning (etching) treatment. As in FIG. 18, the treating unit U configured to perform the bevel cleaning treatment may include a holding rotator 47 for holding the rear face of the substrate W in FIGS. 6, 7 through vacuum-suction, for example, and a nozzle 203 for dispensing a treating liquid (e.g., phosphoric acid and hydrogen peroxide mixture $H_3PO_4 + H_2O_2$) to a peripheral edge of the substrate W, for example.

Moreover, combination of the configuration of the apparatus in FIGS. 5 to 7 and 18 with the known configuration is applicable to the treating unit U depending on necessary processing, for example. Moreover, the following is usable as the treating liquid: an ammonia hydrogen peroxide mixed solution (APM), deionized water (DIW), carbonated water, hydrogenated water, ammonia water ($NH_4OH$), SC1, SC2, a citric acid solution, a mixed chemical of hydrofluoric acid and ozone (FOM), a mixed chemical of hydrofluoric acid, hydrogen peroxide solution and deionized water (FPM), hydrofluoric acid (HF), HCl, isopropyl alcohol (IPA), tetramethylammonium hydroxide (TMAH), trimethyl-2-hydroxyethyl ammonium hydroxide solution (CHOLINE).

(5) In the above embodiments and modifications, the two ID blocks 2, 4 include the four in total inversion units R1 to R4 in FIG. 2. Moreover, as illustrated in FIG. 12, the second ID block 4 includes the two inversion units R3, R4. Alternatively, these inversion units R3, R4 may be an inversion path (pass) (corresponding to the configuration of the substrate platform) disposed between the second ID block 4 and the second treating block 5. For instance, in FIG. 12, when the fourth substrate transport mechanism TM4 transports the substrate W to the second treating block 5 configured to perform the rear-face cleaning treatment, the substrate transported to the inversion path by the fourth substrate transport mechanism TM4 is inversed by the inversion path. Thereafter, the third substrate transport mechanism TM3 in the second treating block 5 receives the inversed substrate from the inversion path. Moreover, at least one among the eight substrate platforms PS1 to PS8 may be the inversion path.

(6) In the above embodiments and the modifications, the two treating blocks 3, 5 each include the single treatment layer or the two treatment layers, for example, as in FIGS. 1 and 15. In this regard, the two treating blocks 3, 5 may each include three or more treatment layers arranged in the upward/downward direction. Moreover, the number of the treatment layers in the first treating block 3 may be different from that in the second treating block 5. For instance, the first treating block 3 may include a single treatment layer whereas the second treating block 5 may include two treatment layers as in FIG. 3.

(7) In the above embodiments and modifications, the first ID block 2 includes the two substrate transport mechanisms TM1, TM2. Alternatively, the first ID block 2 may include the single substrate transport mechanism TM1 as in FIG. 19. In this case, a plurality of (e.g., four) platforms 13 may be arranged on a wall 206 of the first ID block 2 in line in the Y-direction. The substrate transport mechanism TM1 may be configured in such a manner as to be movable in the Y-direction by an electric motor in order to take and accommodate substrates W from and into the carrier C placed the platforms 13.

Moreover, as in the first embodiment, the single substrate transport mechanism TM1 of the first ID block 2 may be fixed on a floor of the first ID block 2 so as not to move horizontally (especially, Y-direction). Moreover, the first ID block 2 may include three or more substrate transport mechanisms.

(8) In the above embodiments and modifications, the second ID block 4 includes the two substrate transport mechanisms TM4, TM5. Alternatively, the second ID block 4 may include the single substrate transport mechanism TM4 as in FIG. 19. Also in this case, a plurality of (e.g., four) platforms 74 may be arranged on a wall 208 of the second ID block 4 in line in the Y-direction. The substrate transport mechanism TM4 may be configured in such a manner as to be movable in the Y-direction by an electric motor in order to take and accommodate substrates W from and into the carrier C placed the platforms 74.

Moreover, as in the first embodiment, the single substrate transport mechanism TM4 of the second ID block 4 may be fixed on a floor of the second ID block 4 so as not to move horizontally (especially, Y-direction). Moreover, the second ID block 4 may include three or more substrate transport mechanisms.

(9) In the above embodiments and modifications, the fourth substrate transport mechanism TM4 of the second ID block 4 transports a substrate W among the six substrate platforms PS3 to PS8, the inversion unit R3, and the carrier C placed on the opener 71, as illustrated in FIGS. 1, 2. Moreover, the fifth substrate transport mechanism TM5 transports a substrate W among the six substrate platforms PS3 to PS8, the inversion unit R4, and the carrier C placed on the opener 72.

For instance, the fourth substrate transport mechanism TM4 may transport a substrate W among the four substrate platforms PS3 to PS6 (i.e., between the first treating block 3 and the second treating block 5). Moreover, the fifth substrate transport mechanism TM5 may transport a substrate W among the two substrate platforms PS7, PS8 and the carrier C on the opener 72. Such task is replaceable between the fourth substrate transport mechanism TM4 and the fifth substrate transport mechanism TM5. That is, the fourth substrate transport mechanism TM4 may transport a substrate W among the two substrate platforms PS7, PS8 and the carrier C on the opener 71. Moreover, the fifth substrate transport mechanism TM5 may transport a substrate W among the four substrate platforms PS3 to PS6. Here, the fourth substrate transport mechanism TM4 may also transport the substrate W to the inversion unit R3, and the fifth substrate transport mechanism TM5 may transport the substrate W to the inversion unit R4.

(10) In the above embodiments and modifications, the substrate treating apparatus 1 includes the two treating blocks 3, 5. In this regard, the substrate treating apparatus 1 may include three or more treating blocks.

First, the following describes a substrate treating apparatus 1 in FIG. 20. As illustrated in FIG. 20, it is supposed that the substrate treating apparatus 1 includes three (a plurality of) treating blocks 213 to 215 that each perform different predetermined treatments, for example. The three treating blocks 213 to 215 are arranged in line. Moreover, the three treating blocks 213 to 215 corresponds to a first treating block 213, a second treating block 214, and a third treating block 215, respectively. Here, it is supposed that three treating blocks 213 to 215 each include a single treatment layer.

The first treating block 213 includes a rear-face cleaning unit SSR for performing a rear-face cleaning treatment. The second treating block 214 includes an end-face cleaning unit SSB for performing an end-face cleaning treatment. The third treating block 215 includes a front-face cleaning unit SS for performing a front-face cleaning treatment. Moreover, the three treating blocks 213 to 215 each include a third substrate transport mechanism TM3.

The first ID block 2 is connected to the first coating block 213 of the three treating blocks 213 to 215 on a first end. Moreover, the second ID block 4 is disposed between the first treating block 213 and the second treating block 214 of the three treating blocks 213 to 215. That is, the second ID block 4 is disposed between the first treating block 213 on a first end side and the two treating blocks 214, 215 on a second end side.

An operation of the substrate treating apparatus 1 according to this modification will now be described.

Reference is made to FIG. 20. The first ID block 2 takes a substrate W from the carrier C placed on the platform 13, and sends the taken substrate W to the treating block 213 on the first end side. At this time, one of the two inversion units R1, R2 causes the substrate W to inverse for change in direction of the rear face of the substrate W to the upward direction. The treating block 213 on the first end side performs the rear-face cleaning treatment on the sent substrate W whose rear face is directed upwardly. The treating block 213 on the first end side transports the substrate W to the second ID block 4.

The second ID block 4 sends the substrate W, subjected to the rear-face cleaning treatment in the treating block 213 on the first end side, to the treating blocks 214, 215 on the second end side. At this time, one of the two inversion units R3, R4 causes the substrate W to inverse for change in direction of the front face of the substrate W to the upward direction. The second treating block 214 on the second end side performs the end-face cleaning treatment on the sent substrate W whose front face is directed upwardly. Moreover, the third treating block 215 on the second end side performs the front-face cleaning treatment on the sent substrate W whose front face is directed upwardly.

Moreover, the second treating block 214 sends the substrate W to the third treating block 215, and the third treating block 215 returns the substrate W, subjected to the front-face cleaning treatment, to the second treating block 214. Thereafter, the second treating block 214 sends the substrate W to the second ID block 4. In FIG. 20, the second treating block 214 performs the end-face cleaning treatment on the substrate W before sending the substrate W to the third treating block 215 (i.e., in the forward path). Alternatively, the second treating block 214 may perform the end-face cleaning treatment before sending the substrate W to the second ID block 4 (i.e., in the return path).

The second ID block 4 returns the substrate W treated in the treating blocks 214, 215 on the second end side to the carrier C placed on the platform 74.

According to this modification, the platform 13 is disposed on the first ID block 2, and the platform 74 is placed on the second ID block 4. A currently-used carrier platform is provided only on the first ID block 2. Accordingly, the substrate W is transported in both the forward path and the return path between the first ID block 2 and the third treating block 215 on the second end. According to this modification, the substrate W is returned not to the first ID block 2 but to the second ID block 4 disposed between the treating block 213 on the first end side and the treating blocks 214, 215 on the second end side in the return path. Consequently, the transportation process by the treating block 213 on the first end side disposed between the first ID block 2 and the second ID block 4 is reduced in the return path. As a result, an entire throughput of a substrate treating apparatus 1 can be enhanced.

(11) The following describes a substrate treating apparatus 1 in FIG. 21. In the substrate treating apparatus 1 in FIG. 21, the second ID block 4 is disposed between the two treating blocks 213, 214 on the first end side and the treating block 215 on the second end side.

The first treating block 213 includes a front-face cleaning unit SS for performing a front-face cleaning treatment. The second treating block 214 includes an end-face cleaning unit SSB for performing an end-face cleaning treatment. The third treating block 215 includes a rear-face cleaning unit SSR for performing a rear-face cleaning treatment. Moreover, the three treating blocks 213 to 215 each include a third substrate transport mechanism TM3. Here, it is supposed that three treating blocks 213 to 215 each include a single treatment layer.

An operation of the substrate treating apparatus 1 according to this modification will now be described. Reference is made to FIG. 21. The second ID block 4 takes a substrate W from the carrier C placed on the platform 74, and sends the taken substrate W to the third treating block 215 on the second end side. At this time, one of the two inversion units R3, R4 causes the substrate W to inverse for change in direction of the rear face of the substrate W to the upward direction.

The treating block 215 on the second end side performs the rear-face cleaning treatment on the sent substrate W whose rear face is directed upwardly. The treating block 215 returns the substrate W subjected to the rear-face cleaning treatment to the second ID block 4.

The second ID block 4 sends the substrate W, subjected to the rear-face cleaning treatment in the treating block 215 on the second end side, to the treating blocks 213, 214 on the first end side. At this time, one of the two inversion units R3, R4 causes the substrate W to inverse for change in direction of the front face of the substrate W to the upward direction. The second treating block 214 on the first end side performs the end-face cleaning treatment on the sent substrate W whose front face is directed upwardly. The first treating block 213 on the first end side performs the front-face cleaning treatment on the sent substrate W. The second treating block 214 sends the substrate W, subjected to the end-face cleaning treatment, to the first treating block 213, and the first treating block 213 sends the substrate W, subjected to the front-face cleaning treatment, to the first ID block 2.

The first ID block 2 returns the substrate W, subjected to the end-face cleaning treatment and the front-face cleaning treatment in the treating blocks 213, 214 on the first end side, to a carrier C placed on the platform 13.

According to this modification, the platform 13 is disposed on the first ID block 2, and the platform 74 is placed on the second ID block 4. A currently-used carrier platform is provided only on the first ID block 2. Accordingly, the substrate W is transported in both the forward path and the return path between the first ID block 2 and the third treating block 215 on the second end. According to this modification, transportation of the substrate W starts not from the first ID block 2 but from the second ID block 4 disposed between the treating blocks 213, 214 on the first end side and the treating block 215 on the second end side in the forward path. Consequently, the transportation process by the treating blocks 213, 214 on the first end side disposed between the first ID block 2 and the second ID block 4 is reduced in the forward path. As a result, an entire throughput of a substrate treating apparatus 1 can be enhanced.

(12) Moreover, the substrate treating apparatus 1 may be configured and operate as under. Two openers 71, 72 are provided on the second ID block 4, and two openers 71, 72 each include the platform 74. As illustrated in FIG. 22, two platforms 74 may be arranged vertically. Alternatively, as in FIG. 9, the platforms 74 may be arranged horizontally.

Reference is made to FIG. 22. The second ID block 4 (fourth substrate transport mechanism TM4 in FIG. 2) takes a substrate W from the carrier C placed on the platform 74 (first platform) of the opener 71, and sends the taken substrate W to the second treating block 5. The second treating block 5 performs a rear-face cleaning treatment on the substrate W sent from the second ID block 4, and transports the substrate W to the second ID block 4. The second ID block 4 returns the substrate W, subjected to the rear-face cleaning treatment, to a carrier C placed on the platform 74 of the opener 71.

Here, the carrier C placed on the platform 74 of the opener 71 remains on the platform 74 of the opener 71 from when the substrate W is taken from the carrier C to when the treated substrate W is returned. Moreover, the substrate W is inversed at any timing in the rear-face cleaning treatment.

Moreover, the second ID block 4 (fifth substrate transport mechanism TM5 in FIG. 2) takes a substrate W from the carrier C placed on the platform 74 of the opener 72, and sends the taken substrate W to the first treating block 3. The first treating block 3 performs an end-face cleaning treatment and a front-face cleaning treatment on the substrate W sent from the second ID block 4, and sends the substrate W subjected to these treatments to the first ID block 2. The first ID block 2 returns the substrate W, subjected to the end-face cleaning treatment and the front-face cleaning treatment in the first treating block 3, to a carrier C on the platform 13.

Here, after all the substrates W are taken from the carrier C placed on the platform 74 of the opener 72, the carrier transport mechanism 78 transports the empty carrier C from the platform 74 of the opener 72 to the platform 13.

Reference is made to FIG. 23. The first treating block 3 performs the rear-face cleaning treatment, and the second treating block 5 performs the end-face cleaning treatment and the front-face cleaning treatment. The substrate treating apparatus 1 in FIG. 23 performs operation of transporting the substrate in substantially the same manner as that by the substrate treating apparatus 1 in FIG. 22.

According to this modification, the platform 13 is disposed on the first ID block 2, and the two platforms 74 are placed on the second ID block 4. A currently-used carrier platform is provided only on the first ID block 2. Accordingly, the substrate W is transported in both the forward path and the return path between the first ID block 2 and the second treating block 5. According to this modification, the substrate \V can be sent not to the first treating block 3 but to the second treating block 5. Consequently, substrate transportation process by the first treating block 3 is reduced. As a result, an entire throughput of a substrate treating apparatus 1 can be enhanced.

Moreover, only one currently-used ID block performs taking and accommodation of the substrate W from and into the carrier C. According to this modification, the second ID block 4 takes the substrate W, and sends the taken substrate W to the first treating block 3. Moreover, the first ID block 2 accommodates the substrate W, sent from the first treating block 3, into the carrier C on the platform 13. That is, taking of a substrate W is divided from accommodation of a substrate W. Consequently, the second ID block 4 is capable of taking a substrate W only, whereas the first ID block 2 is capable of accommodating a substrate W only. As a result, an entire throughput of a substrate treating apparatus 1 can be enhanced.

In this modification, the substrate treating apparatus 1 performs the rear-face cleaning treatment on the substrate W accommodated in one carrier C, and performs the end-face cleaning treatment and the front-face cleaning treatment on the substrate W accommodated in the other carrier C. In this regard, the substrates W accommodated in one carrier C may be separated into two groups, and the substrate treating apparatus 1 may perform the rear-face cleaning treatment on the substrate W in one of the groups, and may perform the end-face cleaning treatment and the front-face cleaning treatment on the substrate W in the other of the groups.

Detailed description is as under. In the substrate treating apparatus 1 in FIG. 22, the second ID block 4 takes a substrate W from a carrier C of the opener 72. Alternatively, all the substrates W may be taken from the carrier C of the opener 72. The second ID block 4 sends the one group of the taken substrate W to the second treating block 5. The second treating block 5 performs the rear-face cleaning treatment on the sent substrate W, and sends the substrate W to the second ID block 4. Moreover, the second ID block 4 sends the one other group of the substrates W taken from the carrier of the opener 72, to the first treating block 3. The first treating block 3 performs the end-face cleaning treatment and the front-face cleaning treatment on the sent substrates W.

While two cleaning treatments of the end-face cleaning treatment and the front-face cleaning treatment are performed, the substrates W subjected to the rear-face cleaning treatment in the second treating block 5 are successively sent to the second ID block 4. The second ID block 4 returns the substrate W, subjected to the rear-face cleaning treatment, to a carrier C of the opener 72. When all the substrates W in one of the groups to be subjected to the rear-face cleaning treatment are returned to the carrier C, the carrier transport mechanism 78 transports the carrier C from the platform 74 of the opener 72 to the platform 13. Then, the first ID block 2 returns the substrate W, subjected to the end-face cleaning treatment and the front-face cleaning treatment in the first treating block 3, to the carrier C where the one of the groups of the substrates W are accommodated.

The first treating block 3 performs one cleaning treatment (rear-face cleaning treatment), whereas the second treating block 5 performs two cleaning treatments (end-face cleaning treatment and the front-face cleaning treatment). Accordingly, the second ID block 4 is capable of collecting the substrates W, subjected to the rear-face cleaning treatment, into the carrier C while performing the treatments by the second treating block 5. This achieves effective cleaning treatments. In FIGS. 22 and 23, the platform 74 of the opener 71 corresponds to the first platform in the present invention, and the platform 74 of the opener 72 corresponds to the second platform in the present invention.

(13) The substrate treating apparatus 1 described in the above (12) may include three or more treating blocks. FIG. 24 illustrates a second ID block 4 disposed between two treating blocks 213, 214. FIG. 25 illustrates a second ID block 4 disposed between two treating blocks 214, 215. The substrate treating apparatus 1 in FIGS. 24 25 performs operation of transporting the substrate in substantially the same manner as that by the substrate treating apparatus 1 in FIG. 22.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus for treating a substrate, comprising:
    a plurality of treating blocks arranged in line;
    a first indexer block connected to a treating block of the treating blocks on a first end and on which a first carrier platform for placing a carrier capable of accommodating a plurality of substrates thereon is disposed; and
    a second indexer block disposed between at least one treating block on a first end side and at least one treating block on a second end side of the treating blocks and on which a second carrier platform for placing a carrier thereon is disposed; wherein
    the second indexer block takes one substrate from the carrier placed on the second carrier platform and sends the taken substrate to the at least one treating block on the second end side,
    the at least one treating block on the second end side performs a predetermined treatment on the sent substrate,
    the second indexer block sends the substrate, treated in the at least one treating block on the second end side, to the at least one treating block on the first end side,
    the at least one treating block on the first end side performs a predetermined treatment on the sent substrate, and
    the first indexer block returns the substrate treated in the at least one treating block on the first end side to the carrier placed on the first carrier platform,
    the substrate treating apparatus further comprising:
    a carrier transport mechanism configured to transport the carrier between the first carrier platform and the second carrier platform; wherein
    the carrier transport mechanism is mounted on the at least one treating block on the first end side.

2. The substrate treating apparatus according to claim 1, wherein
    the treating blocks includes a first treating block configured to perform a first treatment, and a second treating block configured to perform a second treatment,
    the first indexer block is connected to the first treating block,
    the first treating block is connected to the second indexer block,
    the second indexer block is connected to the second treating block,
    the second indexer block takes the one substrate from the carrier placed on the second carrier platform and sends the taken substrate to the second treating block,
    the second treating block performs a second treatment on the substrate, having been sent from the second indexer block, and returns the substrate subjected to the second treatment to the second indexer block,
    the second indexer block sends the substrate subjected to the second treatment to the first treating block,
    the first treating block performs a first treatment on the substrate, having been sent from the second indexer block, and sends the substrate subjected to the first treatment to the first indexer block, and the first indexer block returns the substrate subjected to the first treatment to the carrier placed on the first carrier platform, wherein the carrier transport mechanism is mounted on the first treating block.

3. The substrate treating apparatus according to claim 2, wherein at least one of the first treating block and the second treating block includes a plurality of treatment layers arranged in an upward/downward direction.

4. A substrate transporting method for a substrate treating apparatus including:

a plurality of treating blocks arranged in line; and a first indexer block connected to a treating block of the treating blocks on a first end and on which a first carrier platform for placing a carrier capable of accommodating a plurality of substrates thereon is disposed; the method comprising:

a taking and sending step of causing a second indexer block, disposed between at least one treating block on a first end side and at least one treating block on a second end side of the treating blocks, to take one substrate from the carrier placed on a second carrier platform disposed in the second indexer block and to send the taken substrate to the at least one treating block on the second end side;

a first treating step of causing the at least one treating block on the second end side to perform a predetermined treatment on the sent substrate;

a first sending step of causing the second indexer block to send the substrate, treated in the at least one treating block on the second end side, to the at least one treating block on the first end side;

a second treating step of causing the at least one treating block on the first end side to perform a predetermined treatment on the sent substrate; and a returning step of causing the first indexer block to return the substrate treated in the at least one treating block on the first end side to the carrier placed on the first carrier platform, the substrate treating apparatus further including:

a carrier transport mechanism configured to transport the carrier between the first carrier platform and the second carrier platform; wherein the carrier transport mechanism is mounted on the at least one treating block on the first end side.

* * * * *